(12) United States Patent
Van Dal

(10) Patent No.: US 11,081,589 B2
(45) Date of Patent: Aug. 3, 2021

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventor: Mark Van Dal, Linden (BE)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 84 days.

(21) Appl. No.: 16/678,808

(22) Filed: Nov. 8, 2019

(65) Prior Publication Data

US 2020/0075776 A1   Mar. 5, 2020

Related U.S. Application Data

(62) Division of application No. 15/979,854, filed on May 15, 2018, now Pat. No. 10,475,929.

(60) Provisional application No. 62/593,096, filed on Nov. 30, 2017.

(51) Int. Cl.
| | |
|---|---|
| *H01L 29/76* | (2006.01) |
| *H01L 29/94* | (2006.01) |
| *H01L 29/786* | (2006.01) |
| *H01L 29/423* | (2006.01) |
| *H01L 29/10* | (2006.01) |
| *H01L 29/06* | (2006.01) |
| *H01L 29/66* | (2006.01) |
| *H01L 29/775* | (2006.01) |

(52) U.S. Cl.
CPC .... *H01L 29/78642* (2013.01); *H01L 29/0676* (2013.01); *H01L 29/1037* (2013.01); *H01L 29/42392* (2013.01); *H01L 29/66666* (2013.01); *H01L 29/775* (2013.01)

(58) Field of Classification Search
CPC ............. H01L 27/0688; H01L 27/1108; H01L 29/0676; H01L 29/1037; H01L 29/1079; H01L 29/20; H01L 29/401; H01L 29/41741; H01L 29/42392; H01L 29/66469; H01L 29/66666; H01L 29/78642
USPC ........................................................ 257/329
See application file for complete search history.

(56) References Cited

U.S. PATENT DOCUMENTS

| | | | |
|---|---|---|---|
| 9,209,247 B2 | 12/2015 | Colinge et al. | |
| 9,236,267 B2 | 1/2016 | De et al. | |
| 9,412,817 B2 | 8/2016 | Yang et al. | |
| 9,412,828 B2 | 8/2016 | Ching et al. | |
| 9,472,618 B2 | 10/2016 | Oxland | |

(Continued)

*Primary Examiner* — Theresa T Doan
(74) *Attorney, Agent, or Firm* — Maschoff Brennan

(57) ABSTRACT

A semiconductor device includes a substrate, an N-type bottom vertical gate-all-around (VGAA) transistor, a P-type bottom VGAA transistor, and a top VGAA transistor. The N-type bottom vertical gate-all-around (VGAA) transistor is over the semiconductor substrate and comprising a first nanowire made of InAs. The P-type bottom VGAA transistor is over the semiconductor substrate and comprising a second nanowire made of Ge. The top VGAA transistor is over the N-type bottom VGAA transistor, in which the top VGAA transistor includes a third nanowire in contact with the N-type bottom VGAA transistor, a fourth nanowire on and in contact with the third nanowire, and a bit line wrapping the fourth nanowire.

20 Claims, 39 Drawing Sheets

(56) References Cited

U.S. PATENT DOCUMENTS

| | | |
|---|---|---|
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2010/0187503 A1* | 7/2010 | Moriyama ........ H01L 29/78687 257/24 |
| 2011/0133167 A1* | 6/2011 | Bangsaruntip .... H01L 29/66772 257/24 |
| 2015/0171032 A1 | 6/2015 | Colinge et al. |
| 2016/0049489 A1 | 2/2016 | Wan et al. |

\* cited by examiner

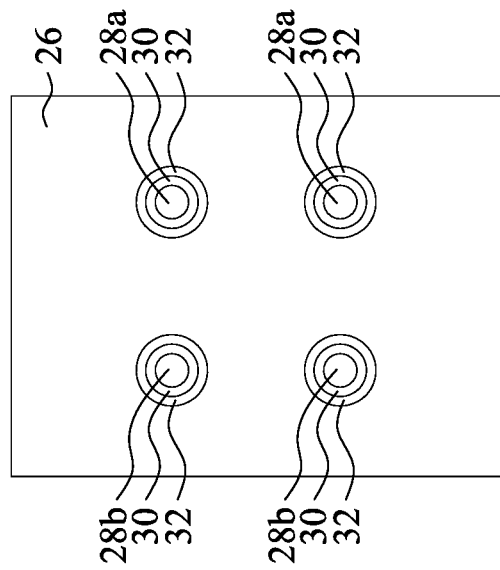
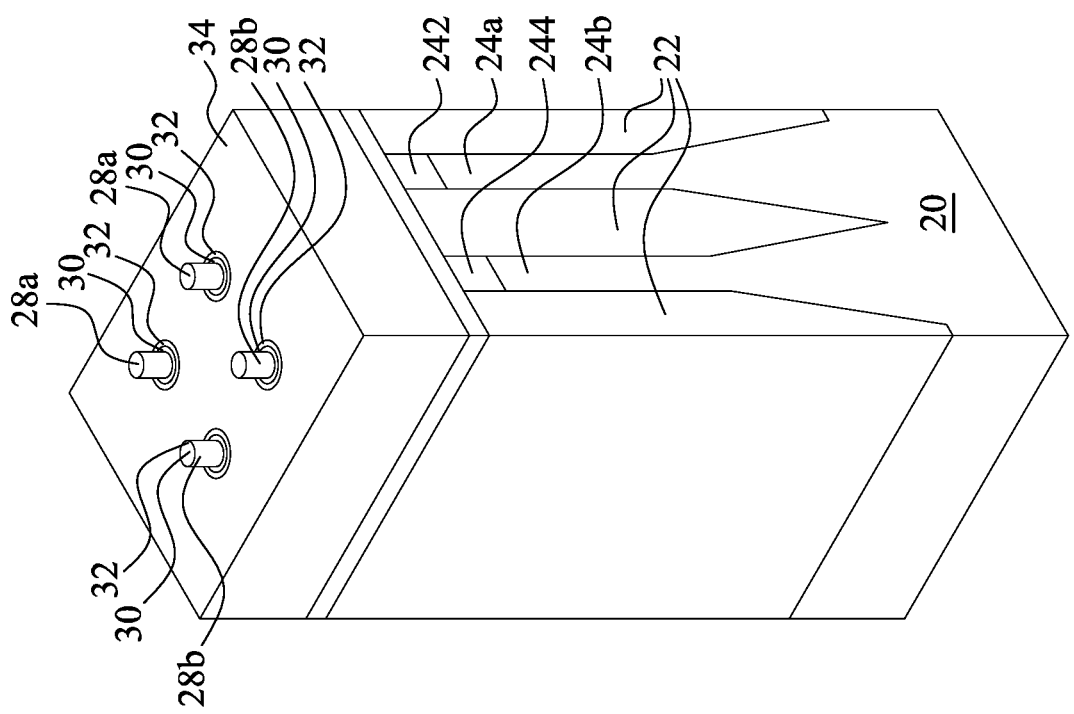
Fig. 11B
Fig. 11A

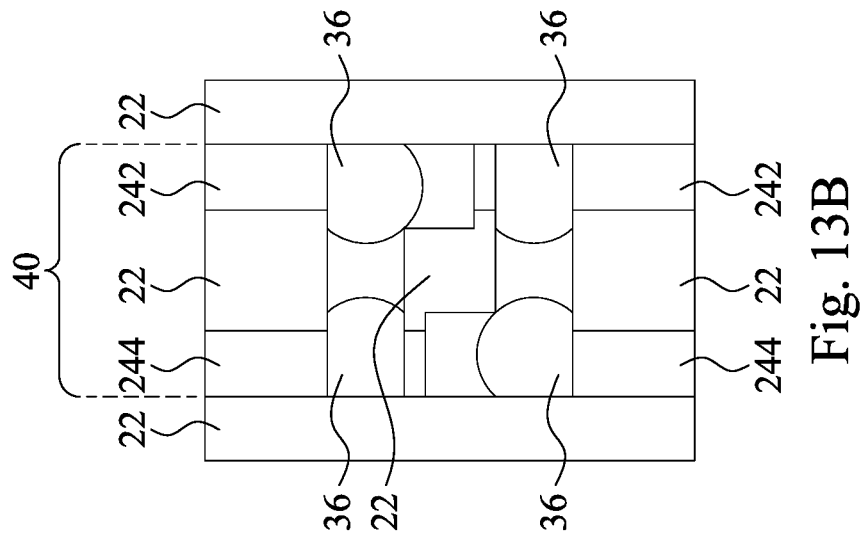
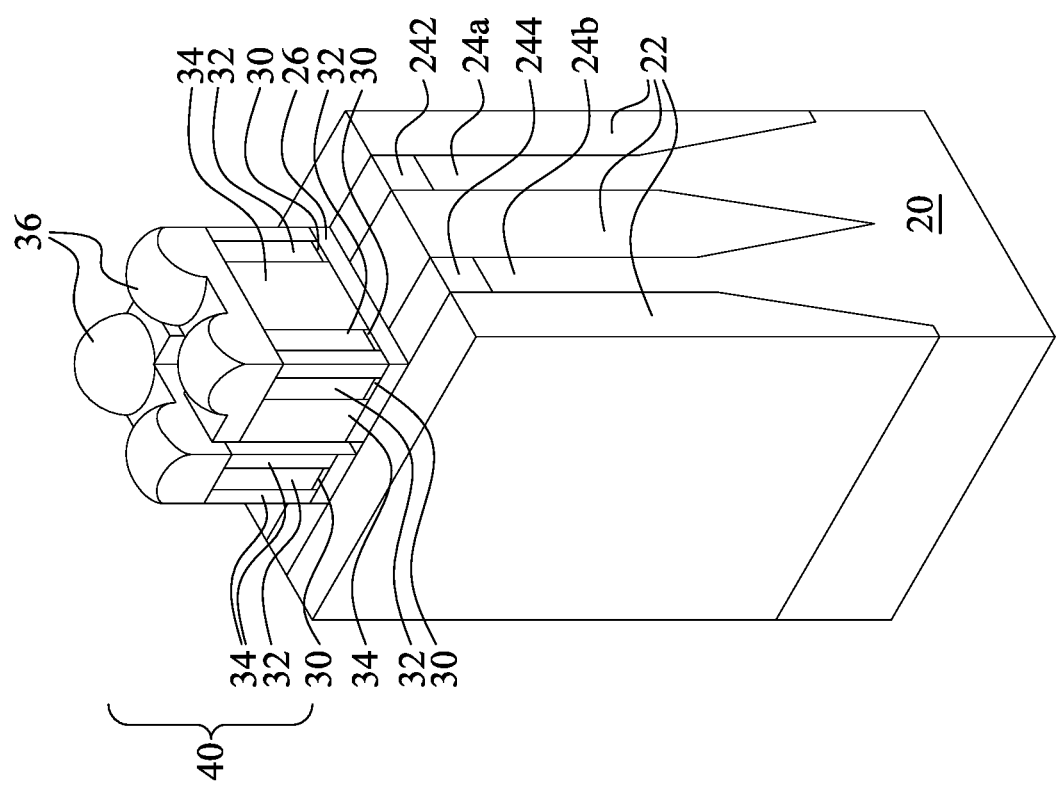

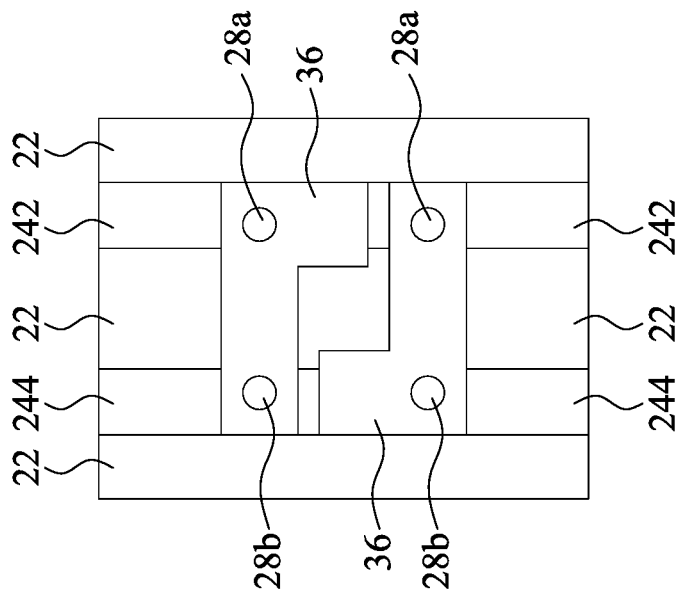
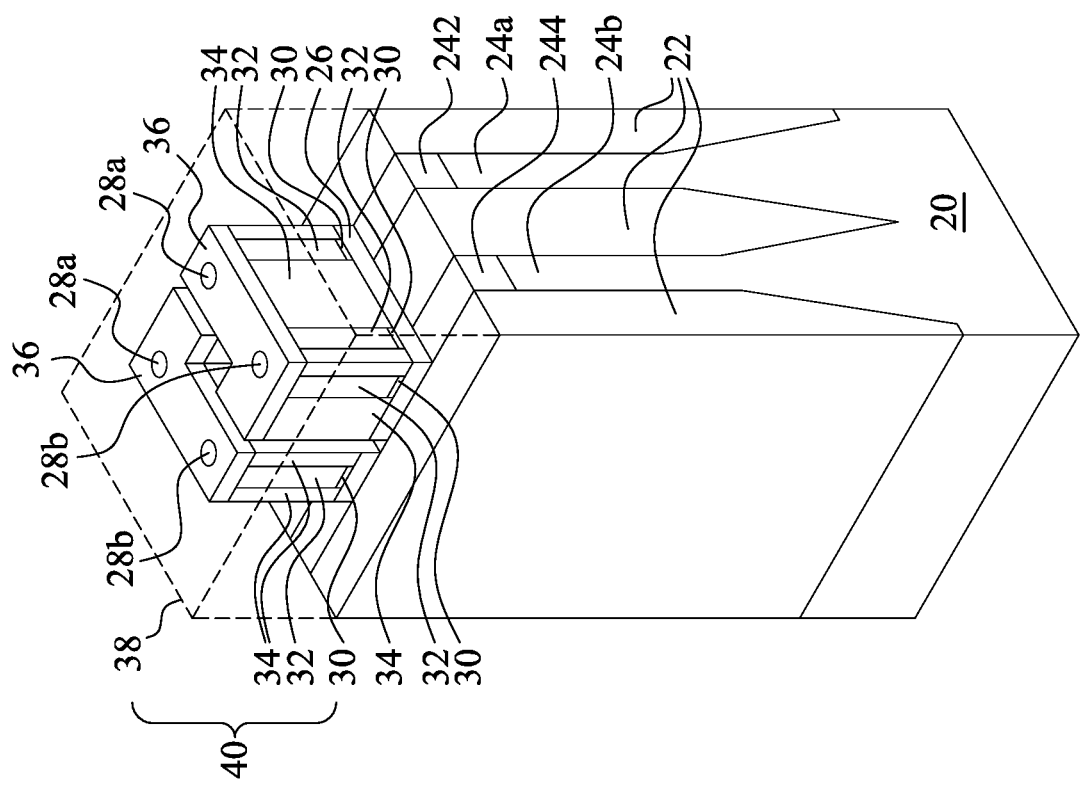
Fig. 14B
Fig. 14A

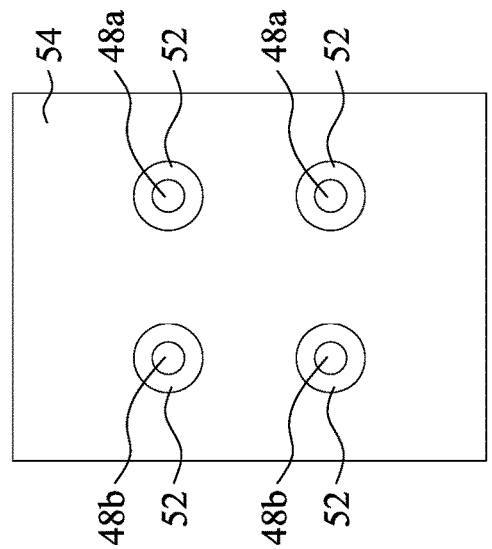
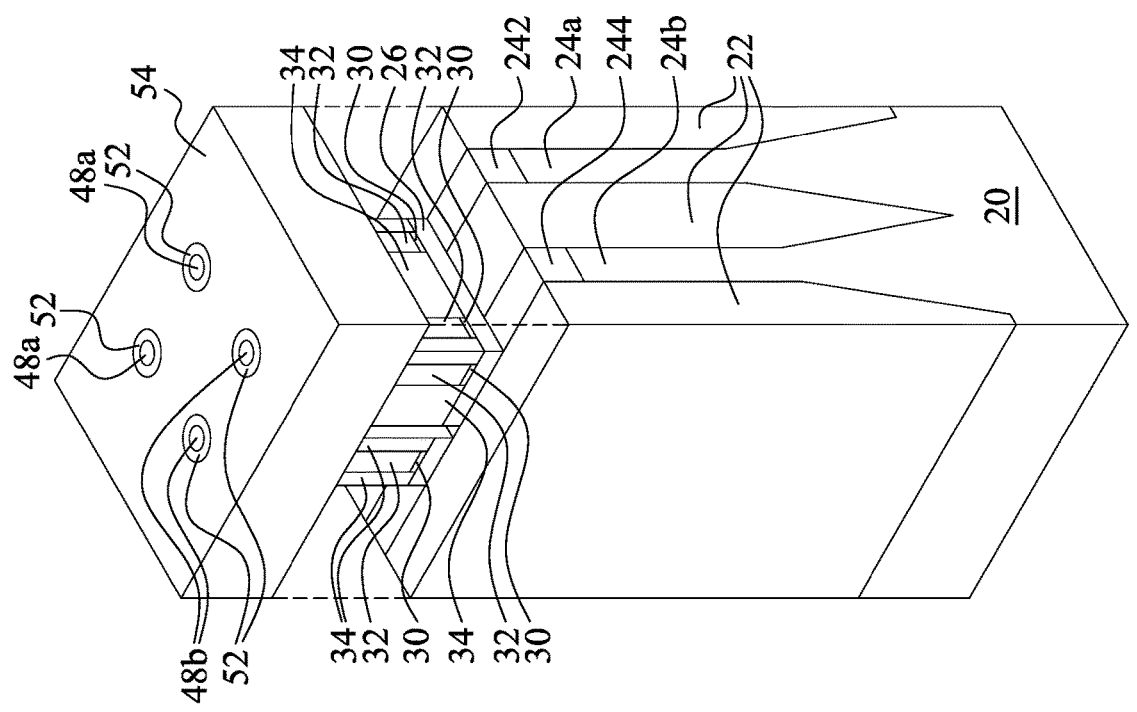
Fig. 19B
Fig. 19A

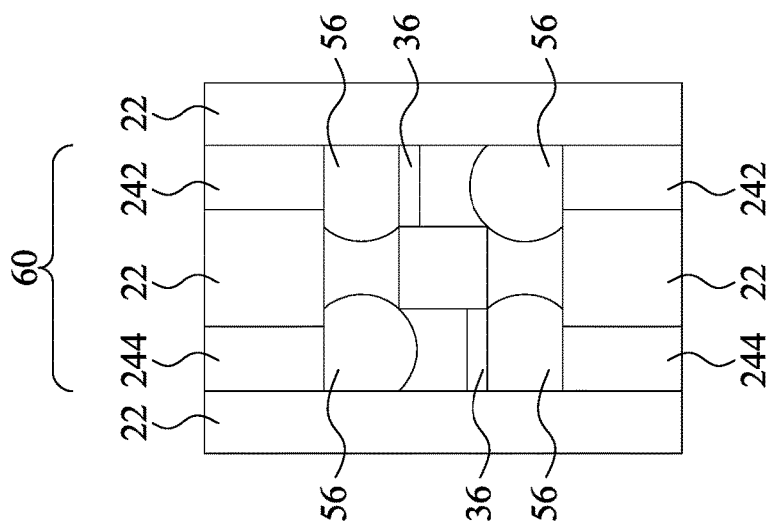
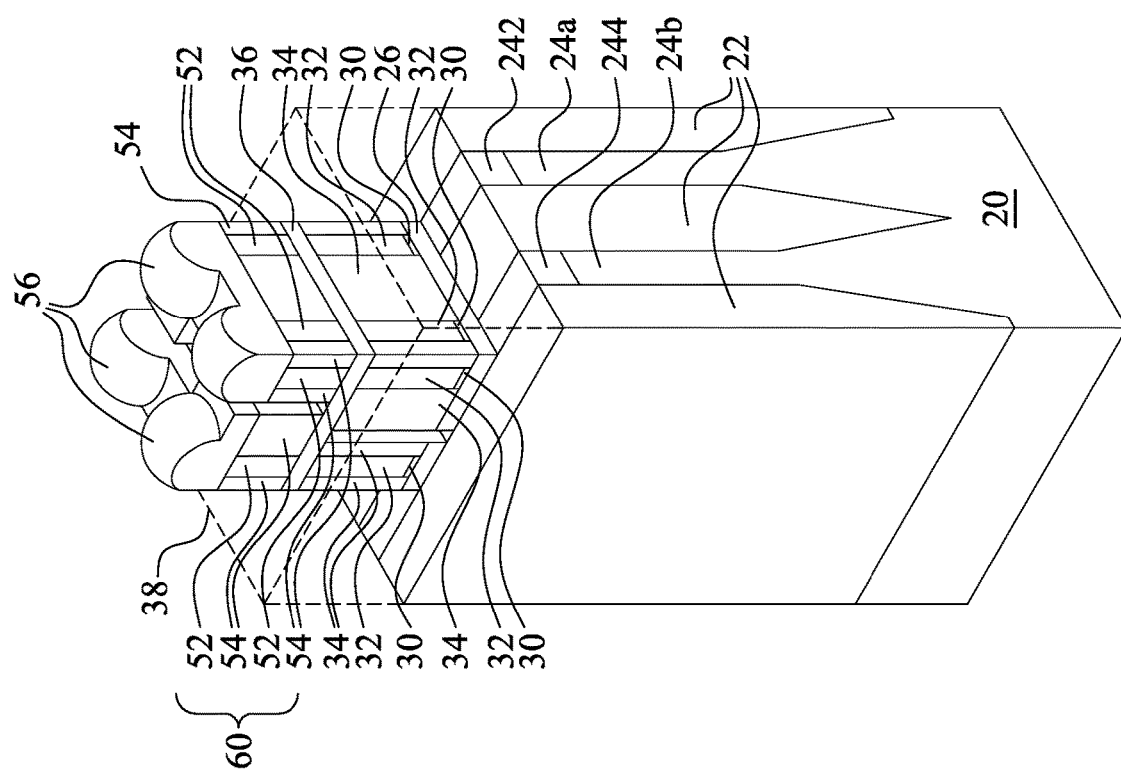

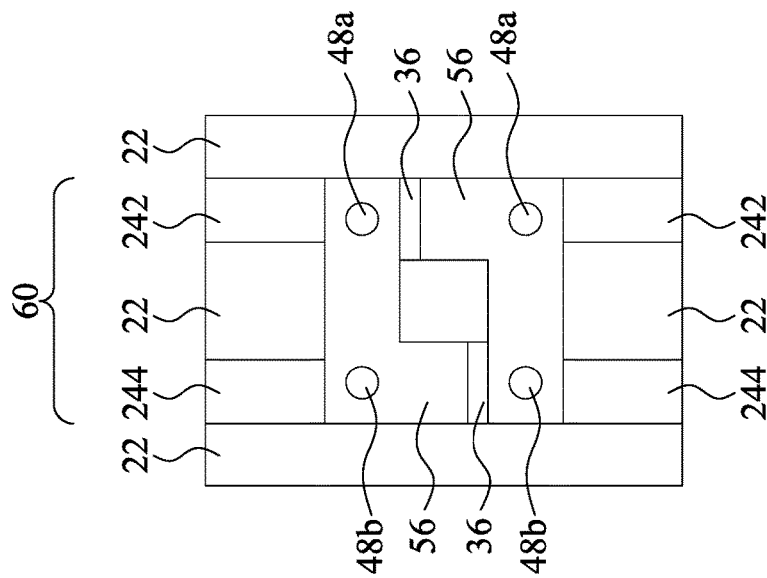
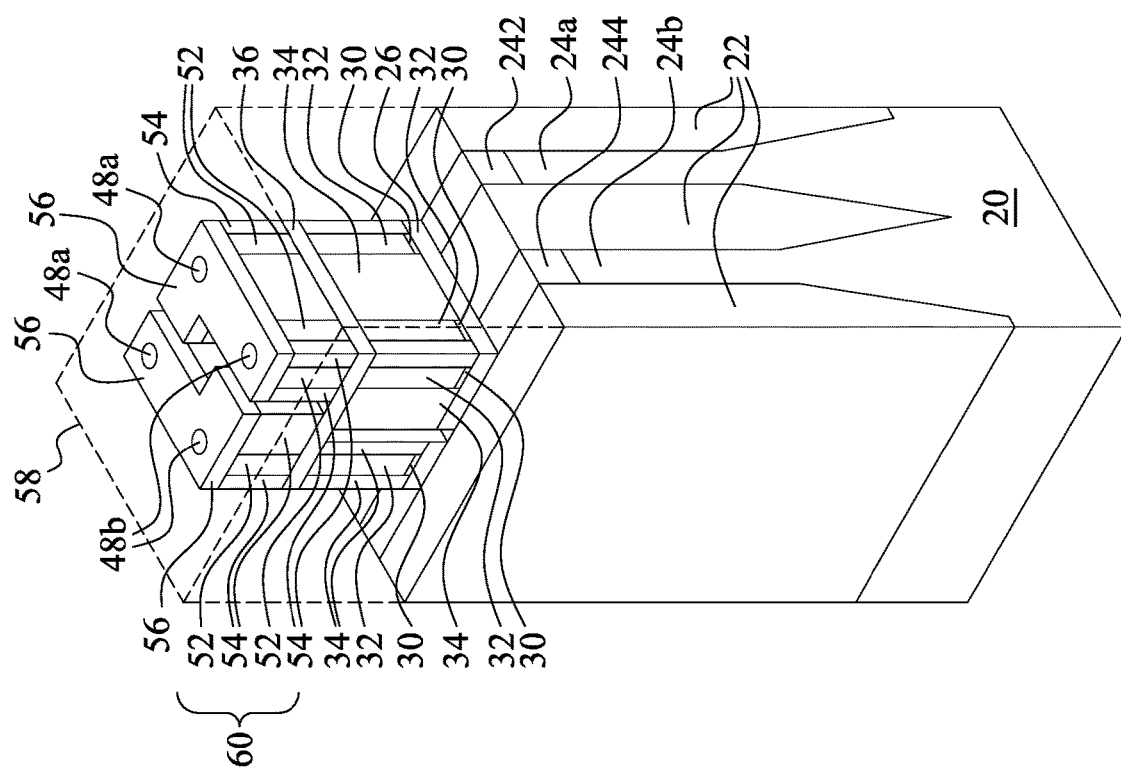
Fig. 23B
Fig. 23A

SEMICONDUCTOR DEVICE AND MANUFACTURING METHOD THEREOF

PRIORITY CLAIM AND CROSS-REFERENCE

The present application is a Divisional application of U.S. application Ser. No. 15/979,854, filed on May 15, 2018, now U.S. Pat. No. 10,475,929, issued on Nov. 12, 2019, which claims priority of U.S. Provisional Application Ser. No. 62/593,096, filed Nov. 30, 2017, which is herein incorporated by reference in their entireties.

BACKGROUND

As the semiconductor industry has progressed into nanometer technology process nodes in pursuit of higher device density, higher performance, lower power consumption and lower costs, challenges from both fabrication and design issues have resulted in the development of three-dimensional designs, such as a fin field effect transistor (finFET). In a finFET device, it is possible to utilize additional sidewalls and to suppress a short channel effect.

Another candidate is a vertical field effect transistor (VFET) device. While a finFET device has a channel extending in a horizontal direction as a fin, in a VFET, a channel extends in a vertical direction (normal direction to a substrate surface). When a VFET is a gate all around (GAA) device, all of the channel layer (surfaces of the channel layer) can be subject to gate control. A GAA device, such as a GAA MOSFET (or MISFET) device, includes a very narrow cylindrical channel body. In particular, a vertical type GAA device (VGAA) having a channel extending in a vertical direction is a promising device for a candidate for low power SRAM applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A through 30B are perspective views and top views respectively of a portion of a semiconductor device at various stages in a vertical nanowire gate-all-around fabrication process in accordance with some embodiments of the instant disclosure;

DETAILED DESCRIPTION

Figure 1:
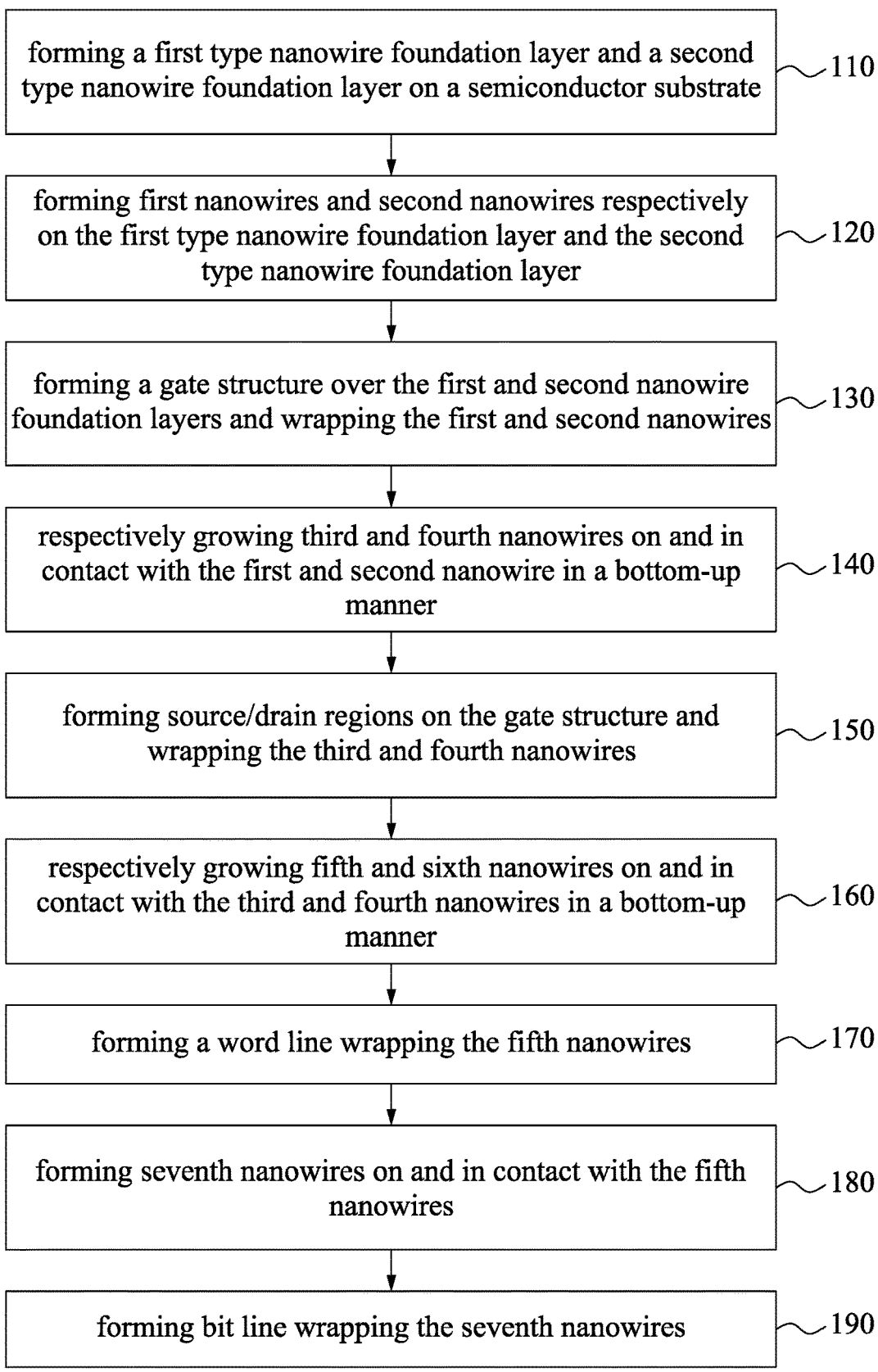
FIG. 1 is a flow chart illustrating a method of fabricating a semiconductor device in accordance with some embodiments of the instant disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Referring to FIG. 1, a flow chart of a method 10 of fabricating a semiconductor device in accordance with some embodiments of the instant disclosure. The method 10 begins with operation 110 in which a first type nanowire foundation layer and a second type nanowire foundation layer are formed on a semiconductor substrate. The method 10 continues with operation 120 in which first nanowires and second nanowires are respectively formed on the first type nanowire foundation layer and the second type nanowire foundation layer. Subsequently, operation 130 is performed that forming a gate structure over the first and second nanowire foundation layers and wrapping the first and second nanowires. The method 10 continues with operation 140 in which third and fourth nanowires are respectively grown on and in contact with the first and second nanowire in a bottom-up manner. The method 10 continues with operation 150 in which source/drain regions are formed on the gate structure and wrapping the third and fourth nanowires. The method 10 continues with operation 160 in which fifth and sixth nanowires are respectively grown on and in contact with the third and fourth nanowires in a bottom-up manner. The method 10 continues with operation 170 in which a word line is formed to wrap the fifth nanowires. The method 10 continues with operation 180 in which seventh nanowires are formed on and in contact with the fifth nanowires. The method 10 continues with operation 190 in which bit line is formed to wrap the seventh nanowires. The discussion that follows illustrates embodiments of semiconductor devices that can be fabricated according to the method 10 of FIG. 1. While method 10 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

GAA field-effect transistors (FETs) show advantages in scaling down the ever more complex semiconductor device. Unlike conventional approach of gate pitch reduction or metal track pitch scaling, VGAA FET does not compromise device performance and even allows denser packaging potential. A two-tier vertical integration in a static random access memory (SRAM) device means the SRAM ports on the top layer and positive supply voltage Vdd and ground (negative) supply voltage Vss are at the bottom, such that lateral expanding is minimized. In some embodiments, the SRAM area scaling down can be smaller than about 0.005 µm$^2$.

Figure 2B:
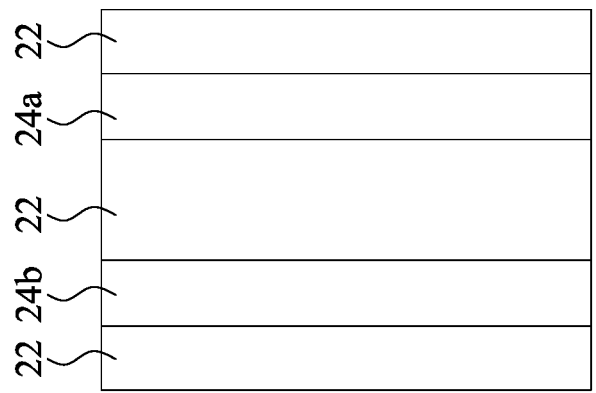
Figure 2A:
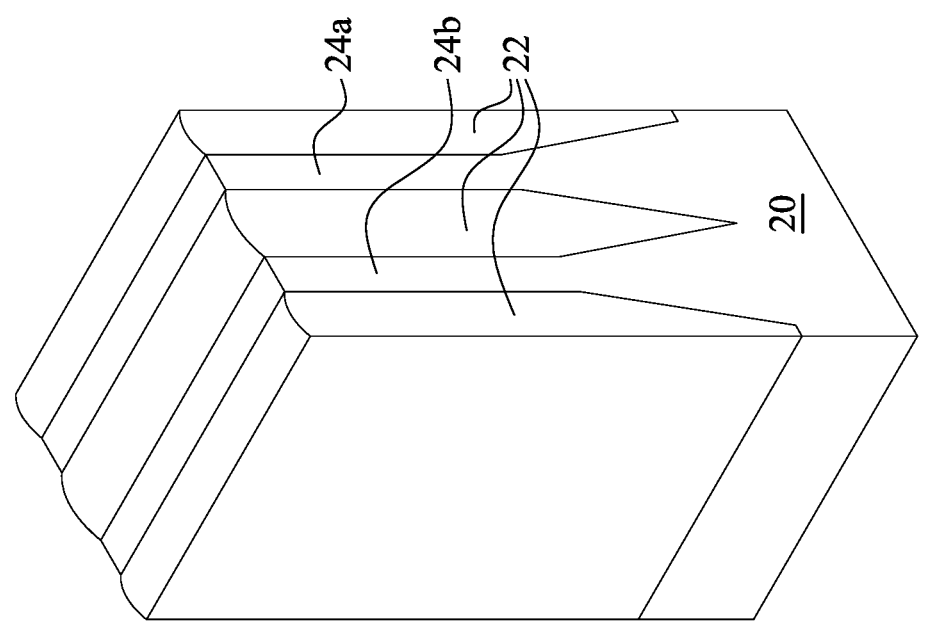

FIGS. 2A through 29B are perspective views and top views respectively of a semiconductor device at various stages in a vertical nanowire GAA fabrication process in accordance with some embodiments of the instant disclosure. Reference is made to FIGS. 2A and 2B and operation 110 in FIG. 1. A fin structure is provided, and the fin structure includes a plurality of fins 24a and 24b on a semiconductor substrate 20. In some embodiments, the semiconductor substrate 20 may include silicon (Si). Alternatively, the semiconductor substrate 20 may include germanium (Ge), silicon germanium, gallium arsenide (GaAs) or other appropriate semiconductor materials. Also alternatively, the semiconductor substrate 20 may include an epitaxial layer. For example, the semiconductor substrate 20 may have an epitaxial layer overlying a bulk semiconductor. Further, the semiconductor substrate 20 may be strained for performance enhancement. For example, the epitaxial layer may include a semiconductor material different from those of the bulk semiconductor such as a layer of silicon germanium overlying a bulk silicon or a layer of silicon overlying a bulk silicon germanium formed by a process including selective epitaxial growth (SEG). Furthermore, the semiconductor substrate 20 may include a semiconductor-on-insulator (SOI) structure such as a buried dielectric layer. Also alternatively, the semiconductor substrate 20 may include a buried dielectric layer such as a buried oxide (BOX) layer, such as that formed by a method referred to as separation by implantation of oxygen (SIMOX) technology, wafer bonding, SEG, or other appropriate method. In various embodiments may include any of a variety of substrate structures and material. Isolation regions 22 are formed on the semiconductor substrate 20 and are used to define the active regions of the semiconductor device. In some embodiments, the isolation regions 22 may be shallow trench isolation structures. In some embodiments, the top surfaces of the fins 24a and 24b are flat while the top surfaces of the isolation regions 22 are convex.

Figure 3B:
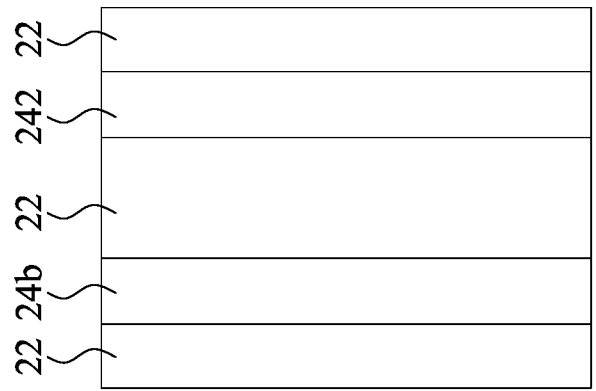
Figure 3A:
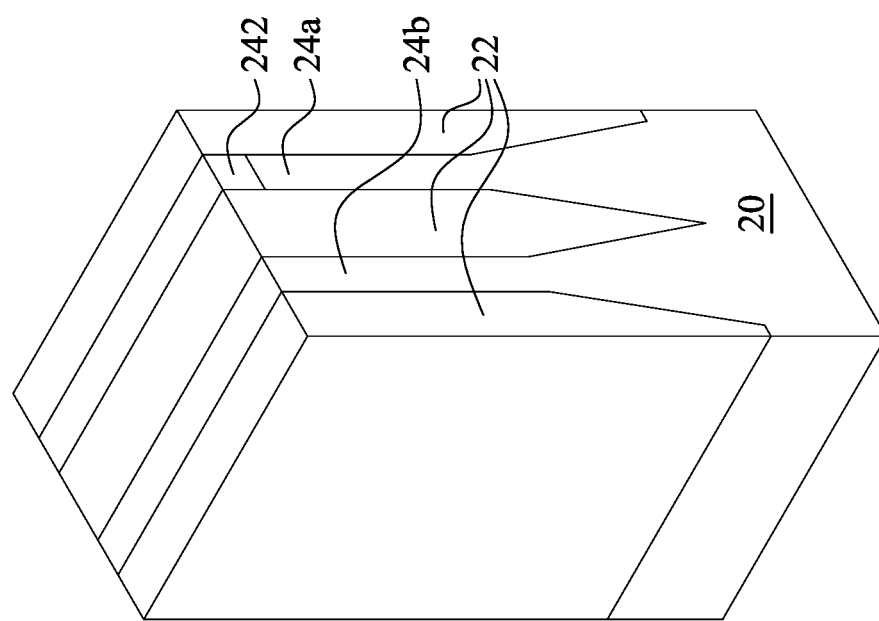

Reference is made to FIGS. 3A and 3B. A planarization process is performed to the fin structure, followed by the fin recession. The planarization process may be for example a chemical mechanical polishing (CMP) process to bring the top surface of the fins 24a and 24b and the isolation regions 22 substantially planar. After planarization, the fin 24a is recessed. The fin recession process in this stage involves a number of the fins 24a and 24b but not all. For example, as shown in FIGS. 3A and 3B, the fin 24a is recessed, while the fin 24b remain un-recessed at this stage. A photolithography process may be used to cover up and protect the fin 24b when the fin recession to the fin 24a is performed. The fin recession to the fin 24a results information of a shallow recession between the isolation regions 22 and on top of the fin 24a such that the top surface of the fin 24a is lower than the isolation regions 22 and the fin 24b.

After the fin recession, a first type nanowire foundation layer 242 fills in the shallow recession over the fin 24a. In some embodiments, the first type nanowire foundation layer 242 may be deposited by epitaxially growing an n-doped channel material or a p-doped channel material depending on the semiconductor device structure. For example, the first type nanowire foundation layer 242 may include an n-doped InAs channel material for an N-type channel. After the first type nanowire foundation layer 242 is formed, the top surface of the first type nanowire foundation layer 242 and the fin 24b are substantially coplanar.

Figure 4B:
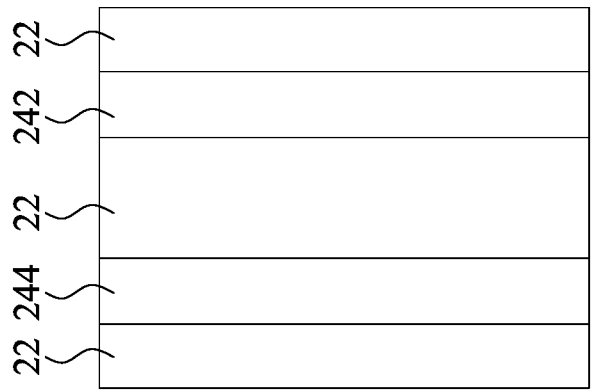
Figure 4A:
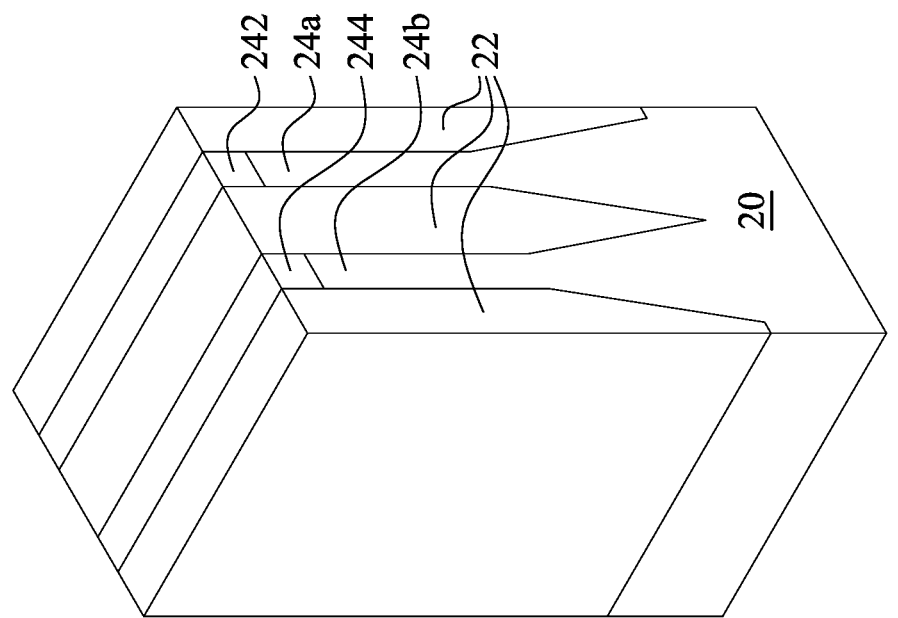

Reference is made to FIGS. 4A and 4B. Similarly, the fin 24b is then recessed to form a shallow recession between the isolation regions 22 and the fin 24b. A photolithography process may be used to cover up and protect the first type nanowire foundation layer 242 when the fin recession to the fin 24b is performed. After the fin recession, a second type nanowire foundation layer 244 fills in the shallow recession over the fin 24b. In some embodiments, the second type nanowire foundation layer 244 may be deposited by epitaxially growing an n-doped channel material or a p-doped channel material depending on the MOS device structure. For example, the second type nanowire foundation layer 244 may include a p-doped Ge channel material for a P-type channel. After the second type nanowire foundation layer 244 is formed, the top surfaces of the first type nanowire foundation layer 242, the second type nanowire foundation layer 244, and the isolation regions 22 are substantially coplanar.

Figure 5B:
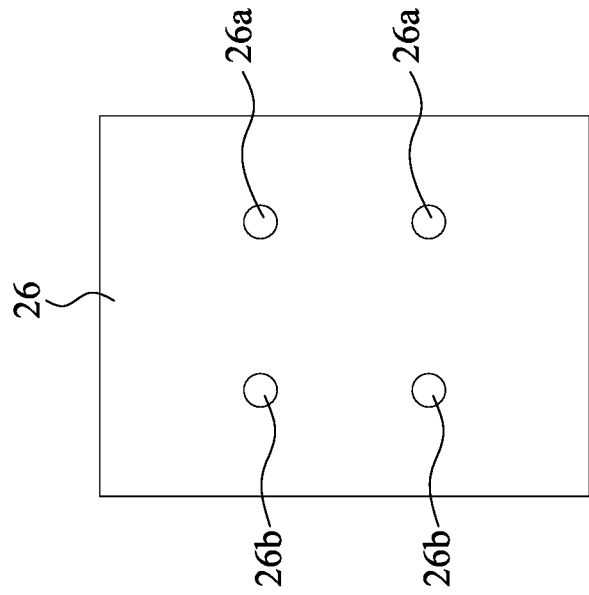
Figure 5A:
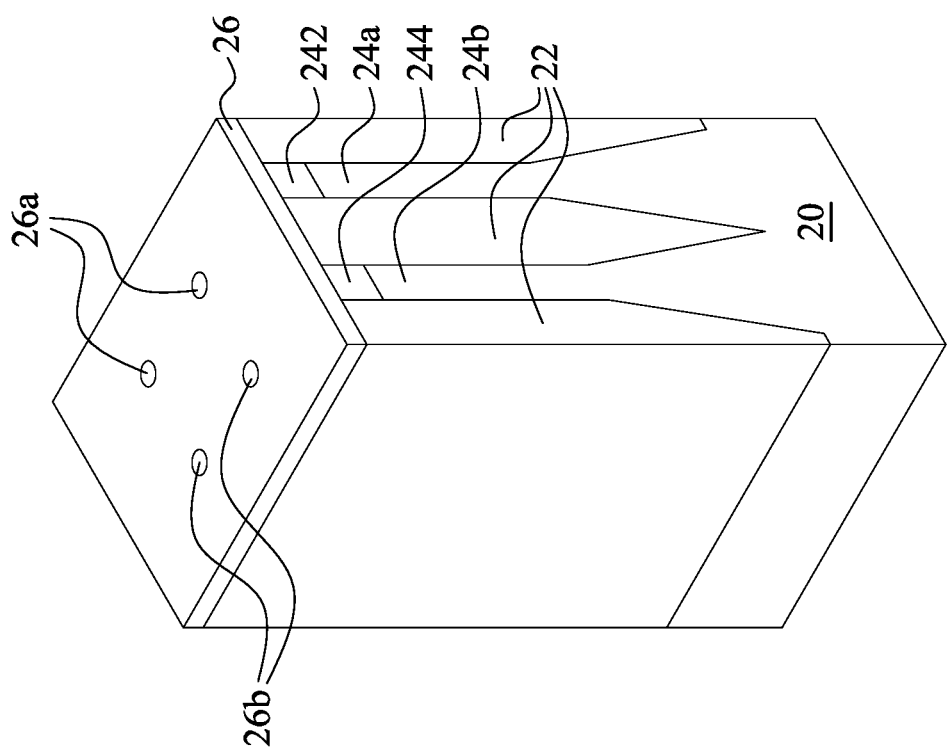

Reference is made to FIGS. 5A and 5B. A nanowire template 26 is formed on the structure of FIGS. 4A and 4B. For example, a template layer is formed and then patterned to form the nanowire template 26. Examples of the nanowire template 26 materials may be dielectric and may include, but not limited, silicon oxide, silicon nitride, silicon oxynitride, or combination thereof. The nanowire template 26 is formed with a pattern that exposes a portion of the underlying first type nanowire foundation layer 242 and the second type nanowire foundation layer 244. In some embodiments, as shown in FIG. 5B, the nanowire template 26 is formed with through holes 26a and 26b. The through holes 26a are aligned over the first type nanowire foundation layer 242, and the through holes 26b are aligned over the second type nanowire foundation layer 244. That is, the through holes 26a expose the first type nanowire foundation layer 242, and the through holes 26b expose the second type nanowire foundation layer 244. The pattern of the nanowire template 26 is later used for nanowire formation (see FIGS. 6A and 6B). The pattern of the nanowire template 26 may adapt to different designs as long as the underlying first type nanowire foundation layer 242 and second type nanowire foundation layer 244 are exposed through the pattern such that the growth of vertical nanowires initiates from the first type nanowire foundation layer 242 and the second type nanowire foundation layer 244.

Figure 6B:
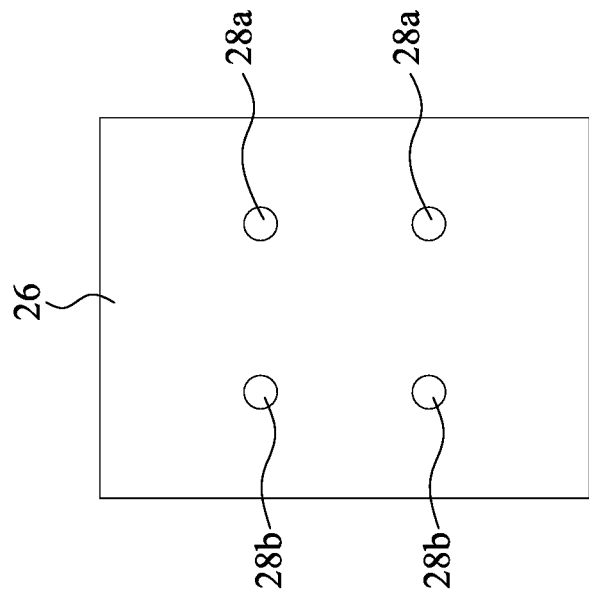
Figure 6A:
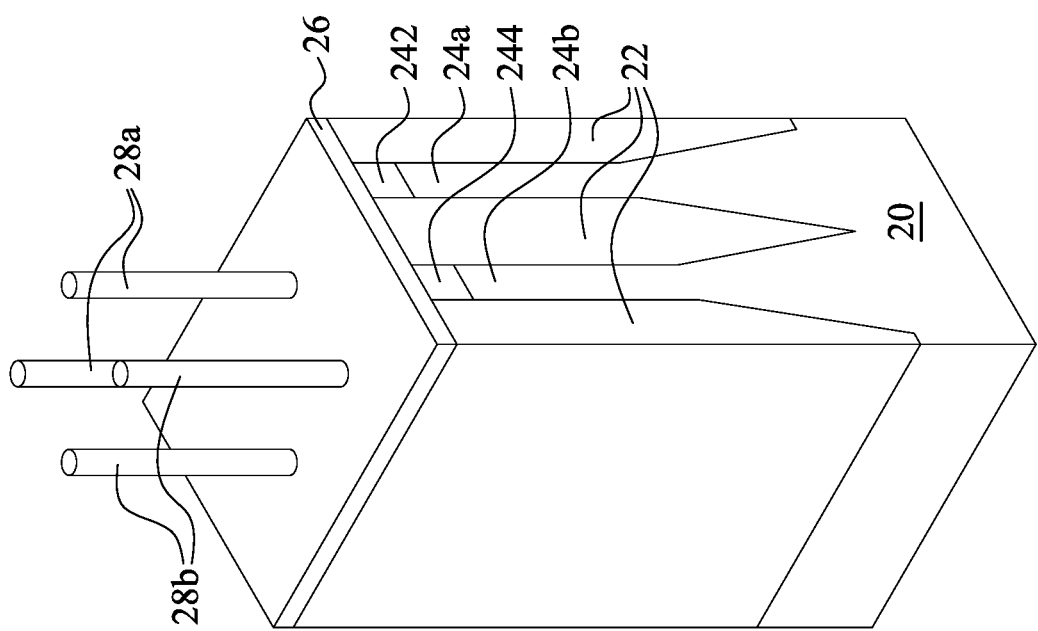

Reference is made to FIGS. 6A and 6B and operation 120 in FIG. 1. First nanowires 28a and second nanowires 28b are grown on the semiconductor substrate 20 in a bottom-up manner. In some embodiments, the first and second nanowires 28*a* and 28*b* are grown with a precursor containing trimethylindium (TMIn) in atomic fraction of $2.5\times10^{-6}$ and tributylarsene (TBA) and/or arsene ($As_3H$) in atomic fraction of $2.5\times10^{-4}$ under 545° C. The ratio between group V-III material in the precursor satisfies III/V is in a range from about 2 to about 15 and may be equal to 100. This ratio of group V-III material in the precursor is the same reaction condition used in the formation of silicon (111). The first and second nanowires 28*a* and 28*b* protrude out of the through holes 26*a* and 26*b* of the nanowire template 26, extending substantially perpendicularly to the nanowire template 26. A photolithography process may be used in the nanowire formation process. When the first nanowires 28*a* are formed, a mask layer (not shown) covers up the through holes 26*b* (before the formation of the second nanowires 28*b*) or the second nanowires 28*b* (after the formation of the second nanowires 28*b*). When the second nanowires 28*b* are formed, a mask layer (not shown) covers up the through holes 26*a* (before the formation of the first nanowires 28*a*) or the first nanowires 28*a* (after the formation of the first nanowires 28*a*). In this way, the first nanowires 28*a* adopt the characteristics of the first type nanowire foundation layer 242, and the second nanowires 28*b* adopt the second type nanowire foundation layer 244. The first and second nanowires 28*a* and 28*b* resemble pillars standing upwardly from the nanowire template 26. This process allows different types of nanowires to be formed on the same surface and be arranged in a compact space. The number and density of the nanowires are determined by the pattern of the nanowire template 26. As shown in FIGS. 6A and 6B, a total of four cylindrical nanowires is formed. The number of the nanowires may be more than four, for example, three in a row, and the instant disclosure is not limited thereto. In some embodiments, the first nanowires 28*a* may be made of InAs, and the second nanowires 28*b* may be made of Ge.

Figure 7B:
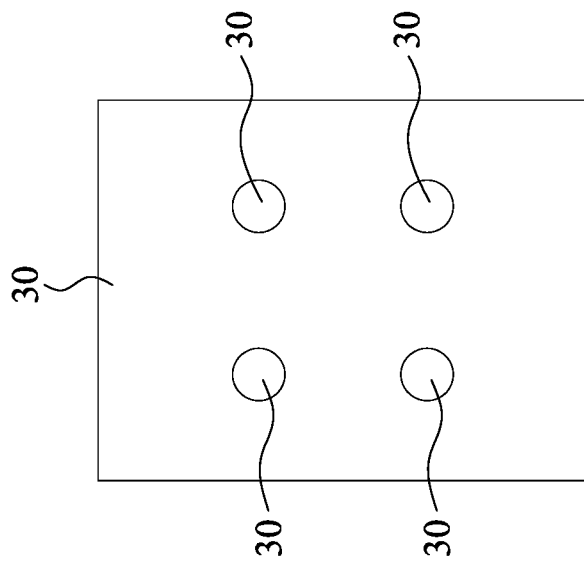
Figure 7A:
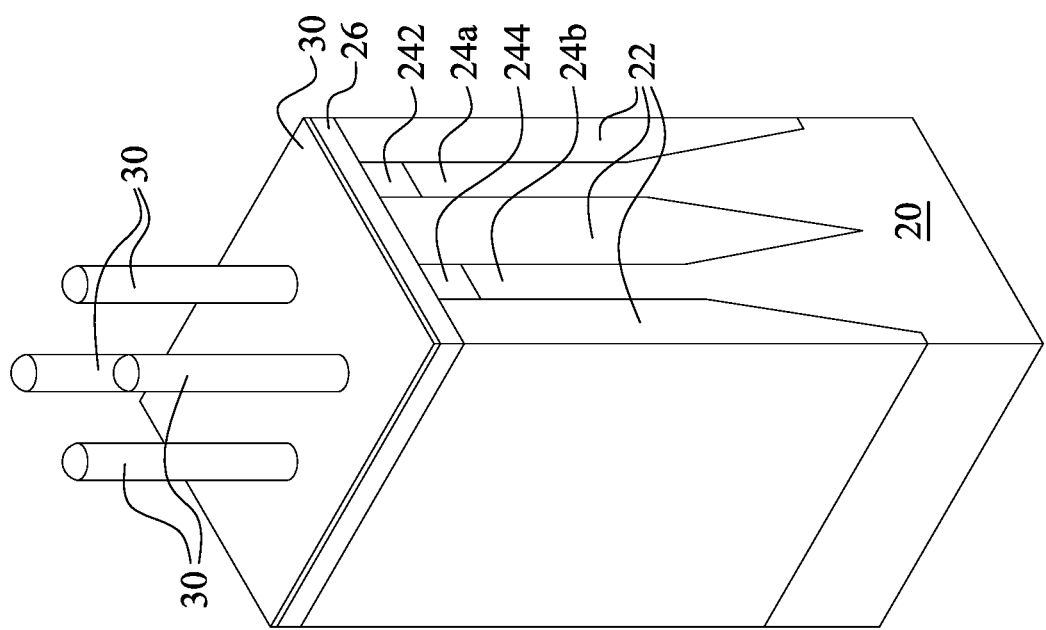

Reference is made to FIGS. 7A and 7B and operation 130 in FIG. 1. A gate dielectric layer 30 is formed on the structure of FIGS. 6A and 6B. The gate dielectric layer 30 is blanket deposited and conforms to the first and second nanowires 28*a* and 28*b* and the nanowire template 26. The contour of the first and second nanowires 28*a* and 28*b* is visible as individual pillar on the semiconductor substrate 20 after the deposition of the gate dielectric layer 30. In some embodiments, the gate dielectric layer 30 includes a passivation layer and a high-k dielectric layer over the passivation layer.

Figure 8B:
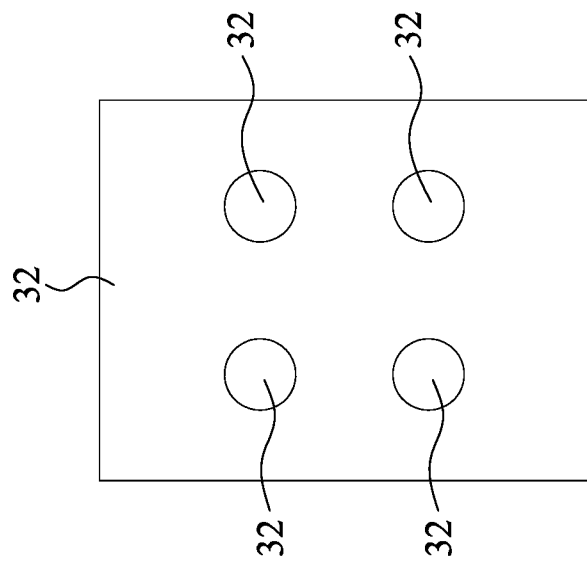
Figure 8A:
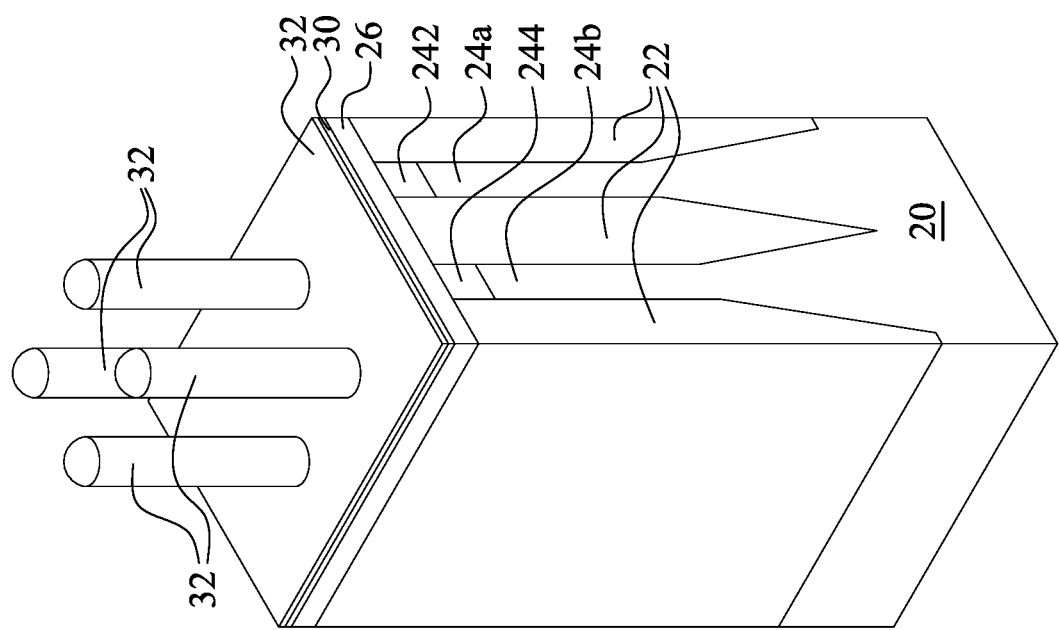

Reference is made to FIGS. 8A and 8B. A metal gate layer 32 is deposited on the gate dielectric layer 30. The metal gate layer 32 is blanket deposited on the semiconductor substrate 20 and conformal to the first and second nanowires 28*a* and 28*b* and on the surface of the nanowire template 26. In some embodiments, the metal gate layer 32 is deposited by for example atomic layer deposition (ALD). As shown in FIG. 8B, the semiconductor substrate 20 is covered up by the metal gate layer 32, and the underlying materials are covered. The metal gate layer 32 includes any metal material suitable for forming a metal gate or portion thereof, including work function layers, liner layers, interface layers, seed layers, adhesion layers, barrier layers or the like.

Figure 9B:
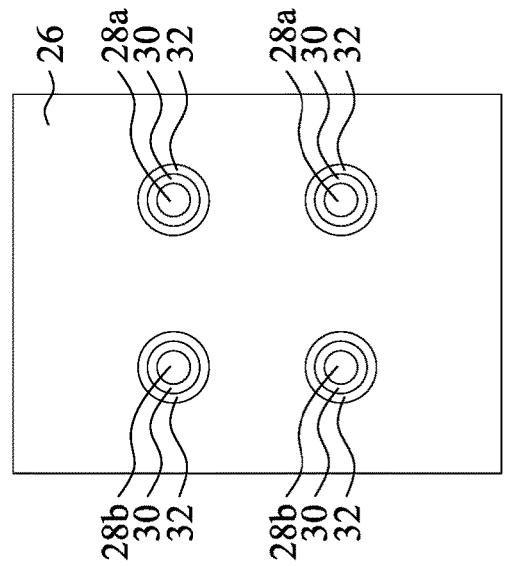
Figure 9A:
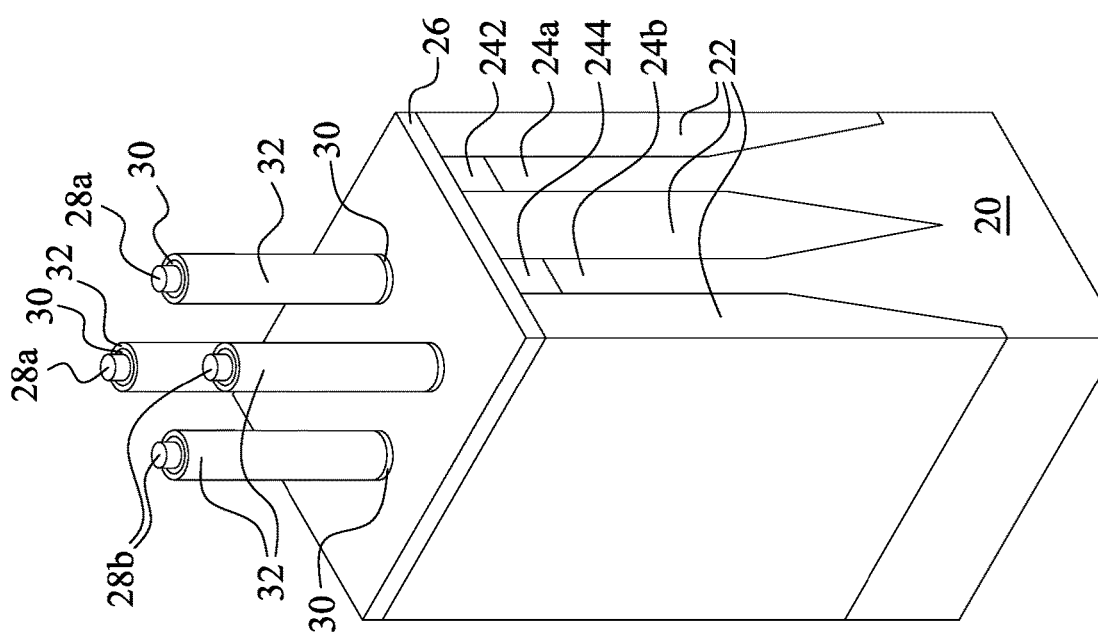

Reference is made to FIGS. 9A and 9B. A removal process (such as etching) is performed to remove portions of the metal gate layer 32 and the gate dielectric layer 30. A directional etching process, for example, dry etch is performed. The directional etching removes the material being etched at different rates in different directions. That is, directional etching does not horizontally as well as vertically into the material, but rather etches in substantially a single direction. The etching process leaves the surface of the nanowire template 26 substantially clear of the metal gate layer 32 and the gate dielectric layer 30, and one terminal of the first and second nanowires 28*a* and 28*b* is exposed. As shown in FIG. 9B, the nanowire template 26 can be seen from the top view, and the first and second nanowires 28*a* and 28*b* are wrapped by the gate dielectric layer 30 and the metal gate layer 32. The middle portion of the first and second nanowires 28*a* and 28*b* are wrapped by the gate dielectric layer 30 and the metal gate layer 32. The bottom portion of the first and second nanowires 28*a* and 28*b*, which is closer to the nanowire template 26, is wrapped by the gate dielectric layer 30 but not the metal gate layer 32, such that a ring of the gate dielectric layer 30 appears between the metal gate layer 32 and the nanowire template 26 to isolate the metal gate layer 32 and the nanowire template 26. The top portion of the first and second nanowires 28*a* and 28*b*, which is opposite to the nanowire template 26, is exposed after the etching process as shown in FIG. 9A. The top portion of the first and second nanowires 28*a* and 28*b* is free of the gate dielectric layer 30 and the metal gate layer 32. Unlike the bottom portion, the gate dielectric layer 30 and the metal gate layer 32 terminate at the same position on the wall of the first and second nanowires 28*a* and 28*b*. Before the etching process, the first and second nanowires 28*a* and 28*b* are linked by the gate dielectric layer 30 and the metal gate layer 32. After the etching process, the first and second nanowires 28*a* and 28*b* are independent from each other without the connection made by the metal gate layer 32. Each of the first and second nanowires 28*a* and 28*b* is encircled by an inner ring of gate dielectric layer 30 and an outer ring of the metal gate layer 32.

Figure 10B:
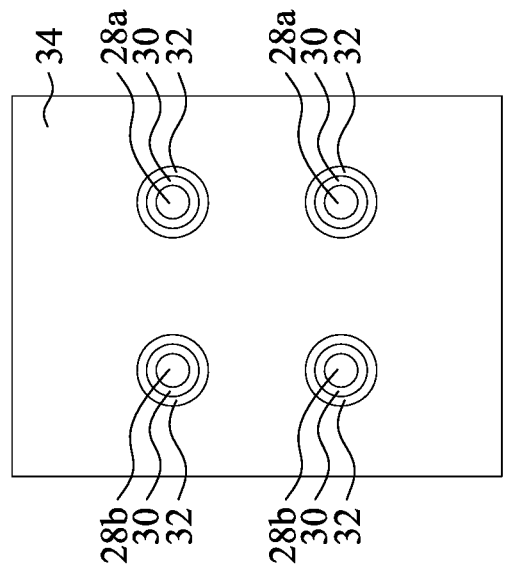
Figure 10A:
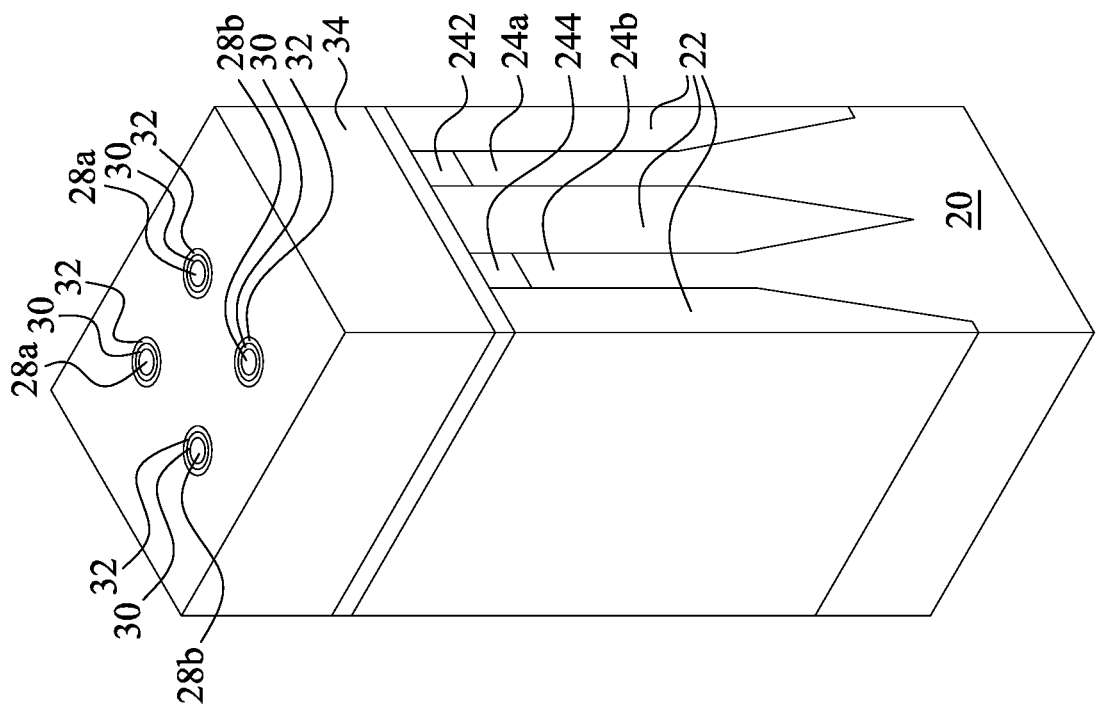

Reference is made to FIGS. 10A and 10B. A filling metal 34 is deposited. The filling metal 34 is deposited on the semiconductor substrate 20 to cover up the entire first and second nanowires 28*a* and 28*b*. The thickness of the filling metal 34 is at least the same as the height of the first and second nanowires 28*a* and 28*b*. After the filling metal 34 deposition, a planarization process is performed. The planarization process may be chemical mechanical polishing (CMP). This planarization process cuts short the height of the first and second nanowires 28*a* and 28*b* (i.e, the removal of the top portion) and continues to a level in which the gate dielectric layer 30 and the metal gate layer 32 come into view again as shown in FIG. 10B.

Reference is made to FIGS. 11A and 11B. A selective recession process is performed. In order to reveal the first and second nanowires 28*a* and 28*b*, the surrounding materials are recessed. The surrounding materials include the outermost filling metal 34, the metal gate layer 32 and the gate dielectric layer 30. The recessing process may be achieved by selective etching, such that the first and second nanowires 28*a* and 28*b* are retained and protrude upwardly from the surface level after the recessing.

Figure 12B:
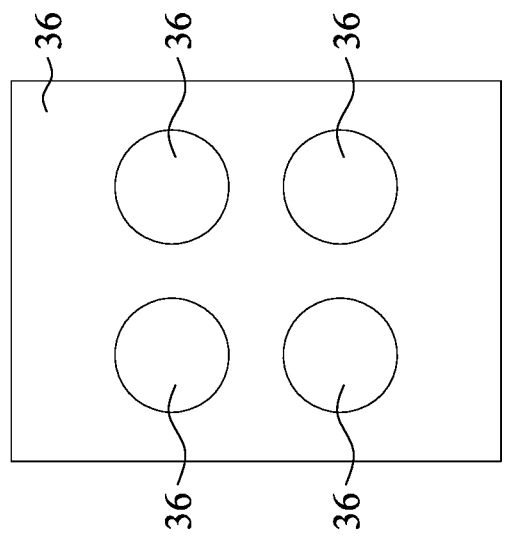
Figure 12A:
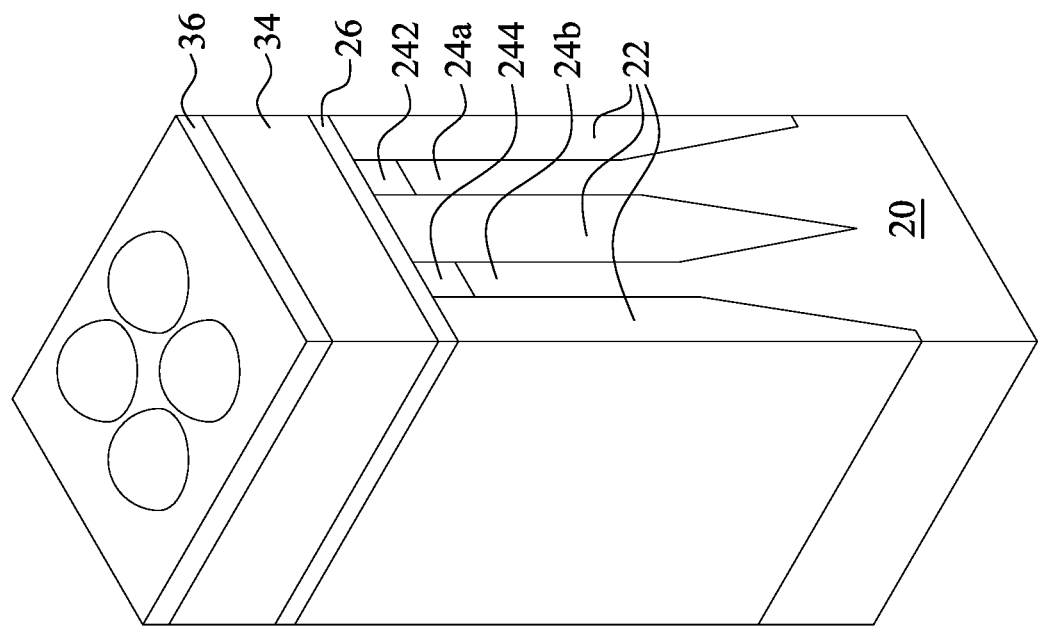

Reference is made to FIGS. 12A and 12B. A spacer 36 is formed on the structure of FIGS. 11A and 11B. Examples of spacer material include dielectric materials including, but not limited to, $Si_3N_4$ and $SiO_2$. The spacer 36 is conformingly formed on the semiconductor substrate 20. The top surface of the filling metal 34 and the protruding first and second nanowires 28*a* and 28*b* are underlying the spacer 36. The protruding first and second nanowires 28*a* and 28*b* result in the bumps in the spacer 36 contour as shown in FIG. 12A.

Reference is made to FIGS. 13A and 13B. The gate materials are patterned. A photolithography and patterning process is performed to form the gate structure 40 as shown in FIG. 13A. The photolithography and patterning process results in the exposure of the isolation regions 22, the first type nanowire foundation layer 242, the second type nanowire foundation layer 244, the gate dielectric layer 30, the metal gate layer 32, and the filling metal 34. In some embodiments, the gate patterning process also lead to portions of the metal gate layer 32 exposure from behind the filling metal 34. In some embodiments, the metal gate layer 32 may not be exposed after gate patterning. As shown in FIG. 13B, the gate structure 40 stands in the central region, and the first nanowires 28a are disconnected through the filling metal 34 and the spacer 36. One of the first nanowires 28a remains connected with one of the second nanowire 28b, which stands in proximity to the first nanowires 28a, through the filling metal 34 and the spacer 36. Likewise, the other pair of first nanowire 28a and second nanowire 28b makes the same connection but in mirror image.

In terms of SRAM arrangement, the gate structure 40 contains two cross couple inverters, including two pull-up gates and two pull-down gates. Each of the inverters resembles a shape of L. One leg of the L crosses between the first nanowire 28a and the second nanowire 28b, substantially perpendicular to the underlying first and second type nanowire foundation layer 242 and 244. The other leg of the L extends in parallel to the lengthwise direction of the first and second type nanowire foundation layer 242 and 244. The two cross couple inverters together form a square-like enclosure but leave gaps in between. The gaps between the cross couple inverters reveal the first and second type nanowire foundation layers 242 and 244 respectively as shown in FIG. 13B.

Reference is made to FIGS. 14A and 14B. An interlayer dielectric layer 38 is deposited on the semiconductor substrate 20. For the sake of clarity, the interlayer dielectric layer 38 is depicted in dotted line and seen through to show the gate structure 40 there within. After the deposition of the interlayer dielectric layer 38, a planarization process, for example, CMP is performed. The bumps of the spacer 36 are flattened in the planarization process, and the underlying first and second nanowires 28a and 28b are exposed as shown in FIG. 14B.

Figure 15B:
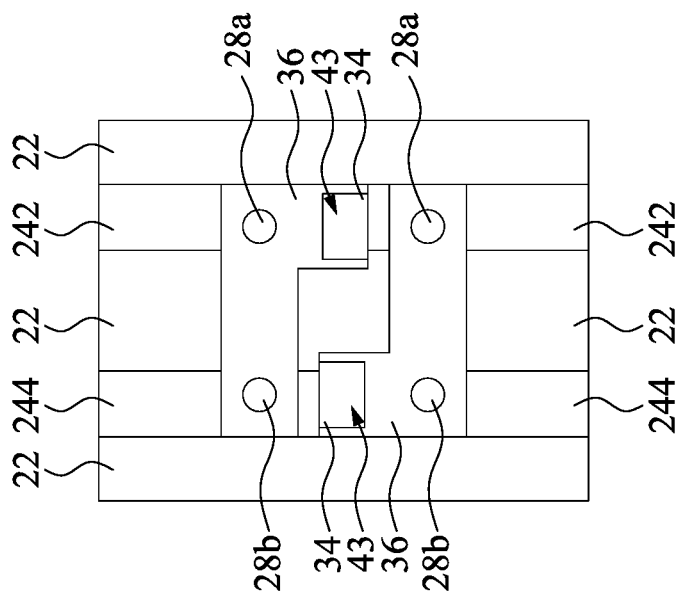
Figure 15A:
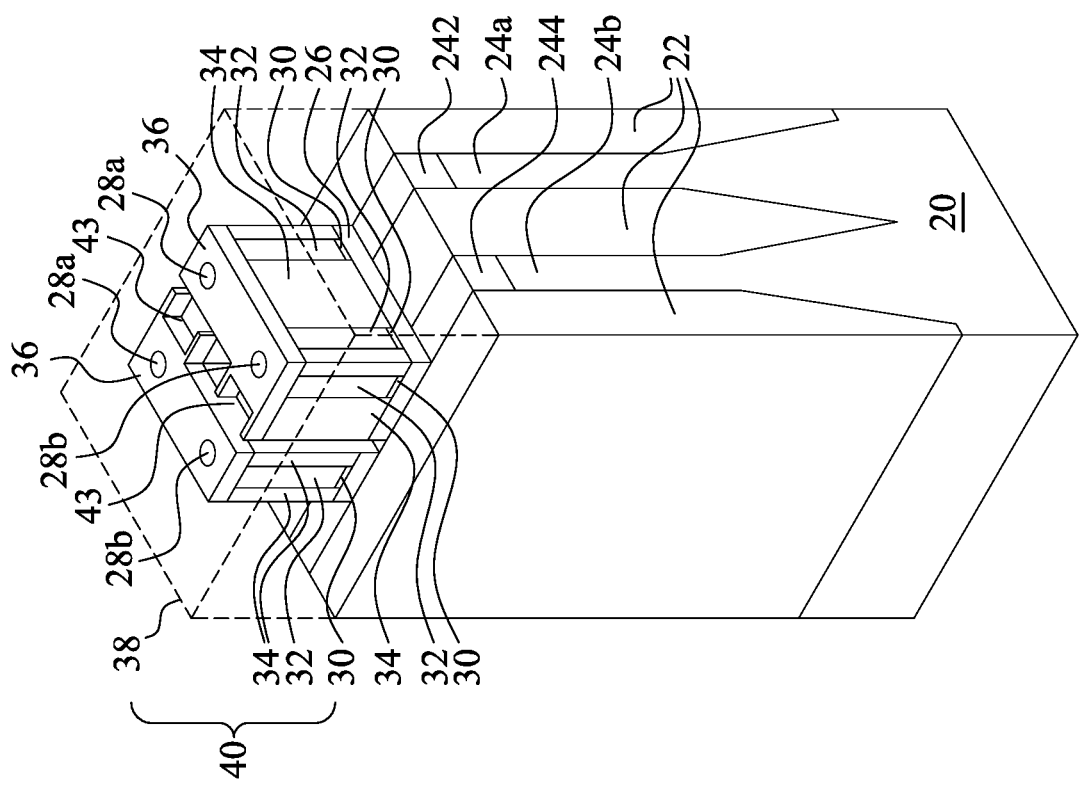

Reference is made to FIGS. 15A and 15B. Contact holes 43 are formed on the gate structure 40. A photolithography and patterning process is performed to form the contact holes 43 so as to expose portions of the filling metal 34 that underlies the spacer 36. Each one of the cross couple inverters has at least one contact hole 43, and the contact hole 43 is positioned between the two first nanowires 28a and between the two second nanowires 28b as shown in FIG. 15B. In some other embodiments, however, the position of the contact holes 43 are not respectively between the two first nanowires 28a and the two second nanowires 28b. Embodiments fall within the present disclosure if the contact holes 43 respectively expose portions of the filling metal 34.

Figure 16B:
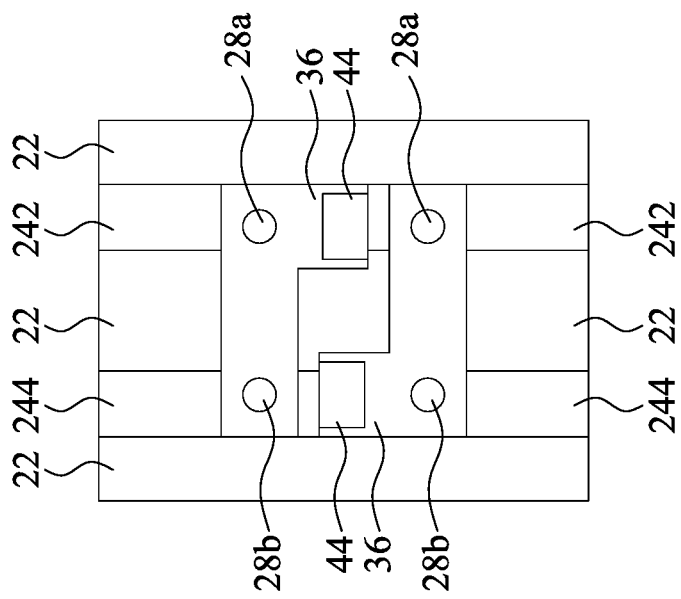
Figure 16A:
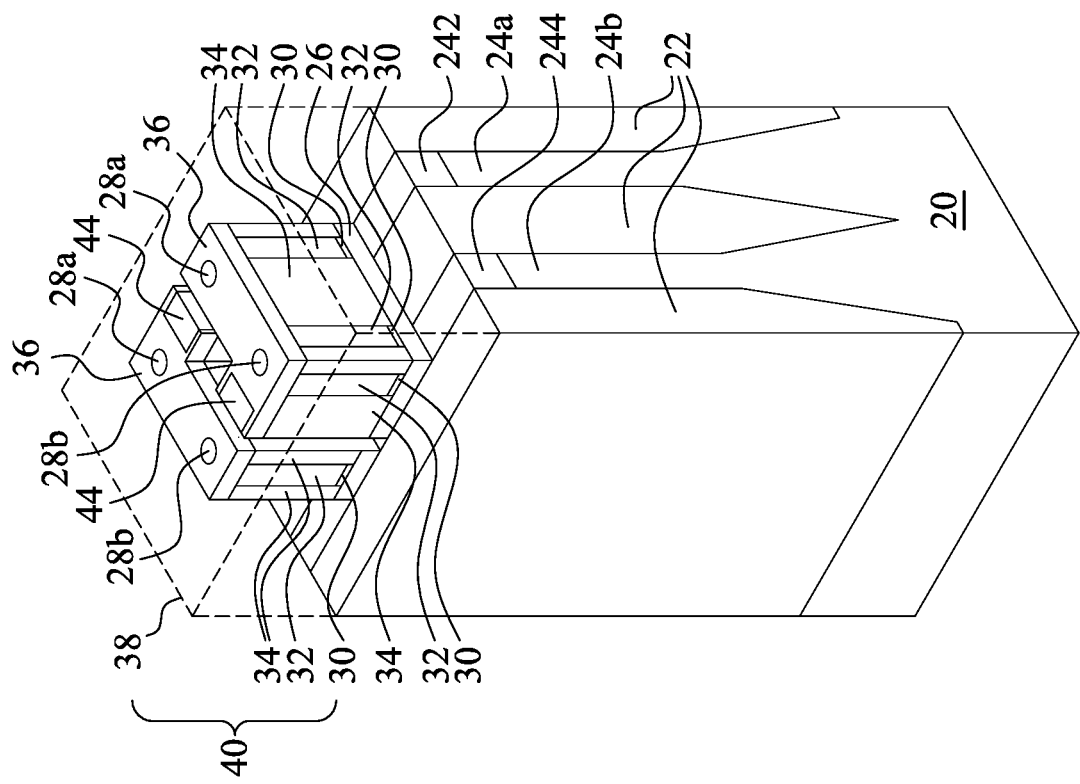

Reference is made to FIGS. 16A and 16B. A contact metal fills in the contact holes 43 to form the gate vias 44. The gate vias 44 allows electrical connection between an upper level and the gate structure 40.

Figure 17B:
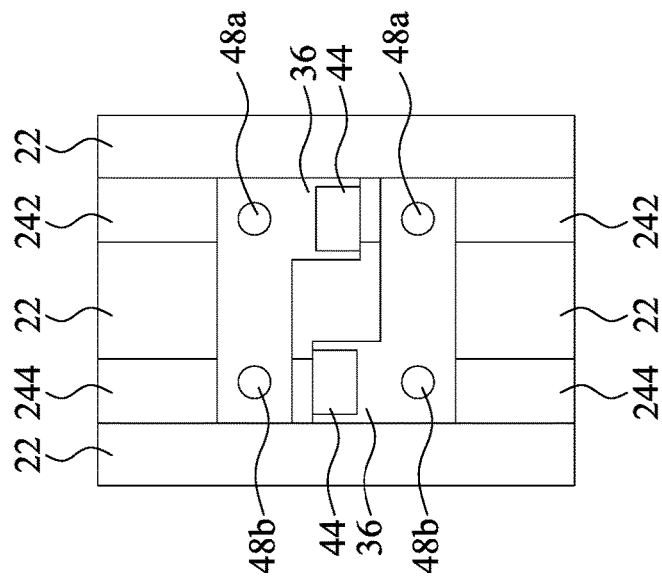
Figure 17A:
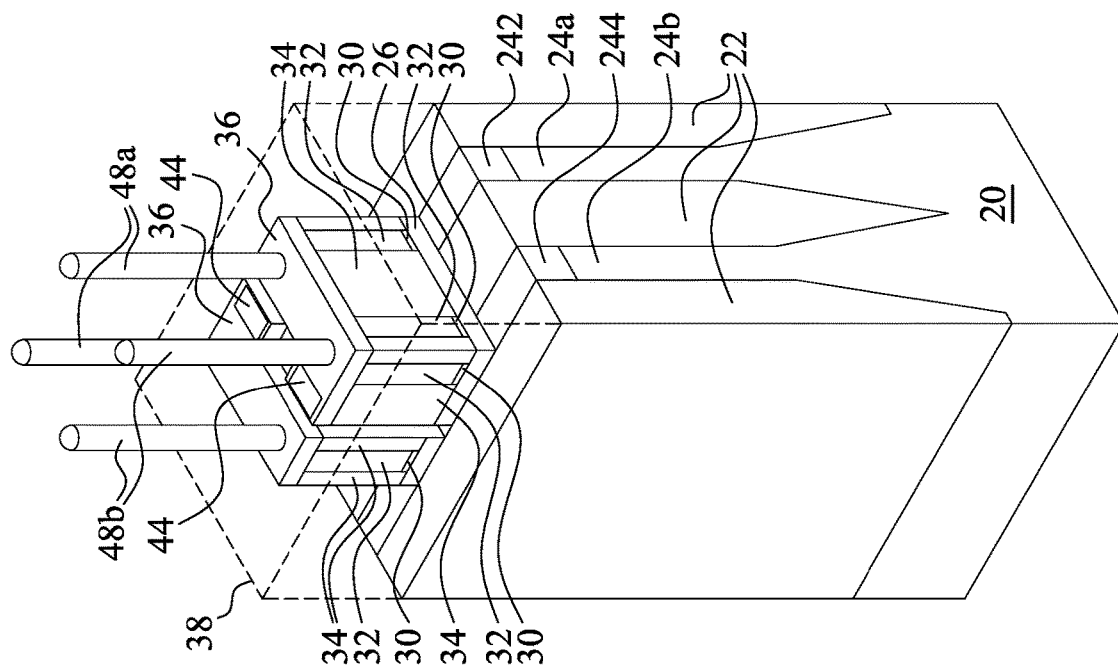

Reference is made to FIGS. 17A and 17B and operation 140 in FIG. 1. Third and fourth nanowires 48a and 48b are formed in a bottom-up manner. The spacer 36 is used as a template similar to the nanowire template 26 (see FIGS. 5A and 5B). The spacer 36 reproduces the pattern of the nanowire template 26, in which the first nanowires 28a is now acting as the first type nanowire foundation layer 242 and the second nanowires 28b is now acting as the second type nanowire foundation layer 244. The third and fourth nanowires 48a and 48b are respectively grown according to the pattern of the first and second nanowires 28a and 28b underlying the spacer 36. The third and fourth nanowires 48a and 48b may be seen as an extension of the first and second nanowires 28a and 28b. A photolithography process may be used for separately growing the third and fourth nanowires 48a and 48b depending on the types of nanowires. The third and fourth nanowires 48a and 48b are formed into the source/drain nanowires. In some embodiments, the third nanowires 48a may be made of InAs, and the fourth nanowires 48b may be made of Ge.

Figure 18B:
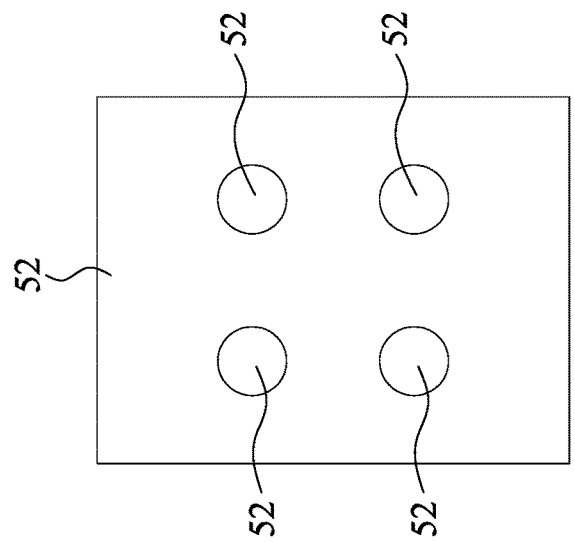
Figure 18A:
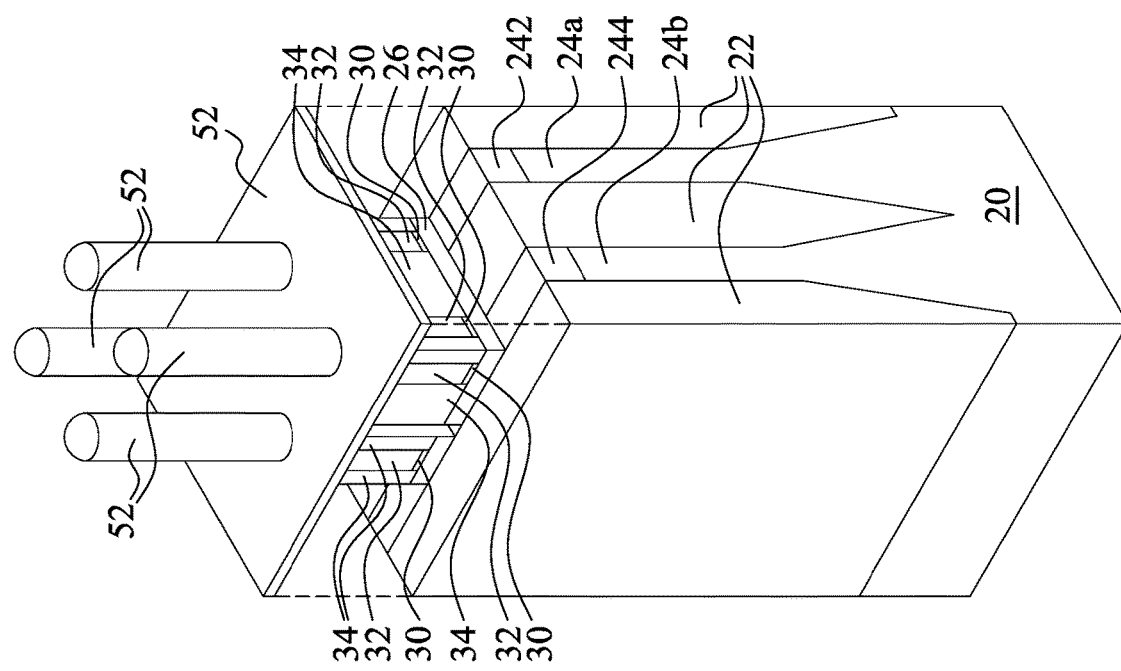

Reference is made to FIGS. 18A and 18B and operation 150 in FIG. 1. A contact metal layer 52 is deposited on the third and fourth nanowires 48a and 48b, such that the gate vias 44 of FIGS. 17A and 17B are in contact with the contact metal layer 52. Unlike the gate structure 40, the third and fourth nanowires 48a and 48b are directly wrapped by the contact metal layer 52 without the gate dielectric layer. The contact metal layer 52 conforms to the shape of the third and fourth nanowires 48a and 48b as four pillars standing on the spacer 36.

Reference is made to FIGS. 19A and 19B. A filling metal 54 is deposited. The filling metal 54 is blanket deposited on the structure of FIGS. 18A and 18B. A planarization process is then performed to expose both the third and fourth nanowires 48a and 48b and the contact metal layer 52 as shown in FIG. 19B.

Figure 20B:
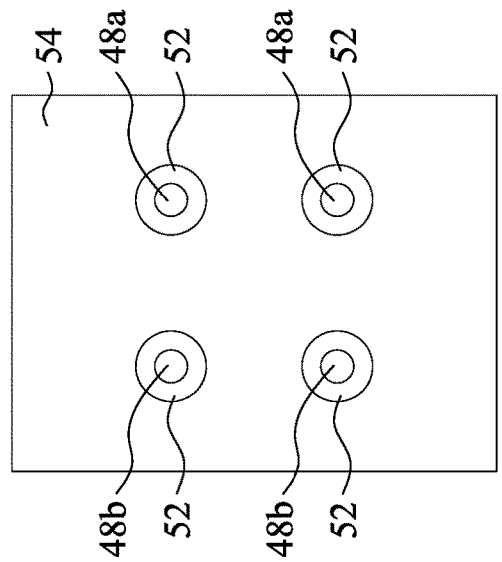
Figure 20A:
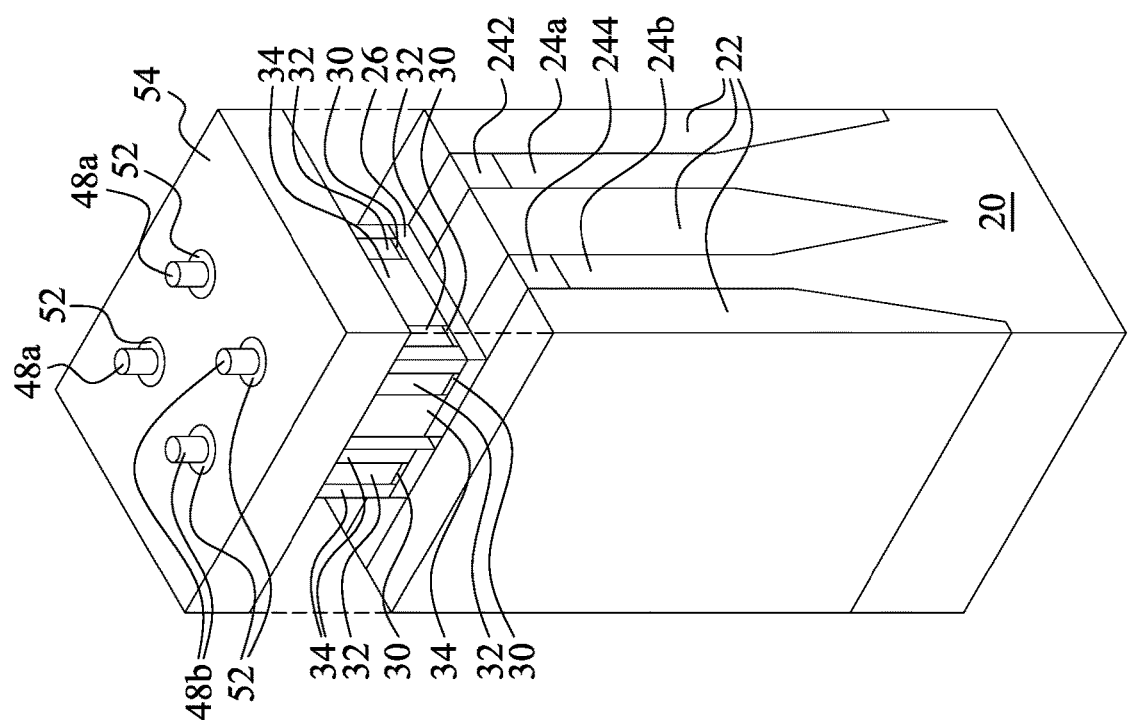

Reference is made to FIGS. 20A and 20B. A selective recession process is performed. In order to reveal third and fourth nanowires 48a and 48b, the surrounding materials are recessed. The surrounding materials include the outermost filling metal 54 and the contact metal layer 52. The recessing process may be achieved by selective etching, such that the third and fourth nanowires 48a and 48b are retained and protrude upwardly from the surface level after the recessing.

Figure 21B:
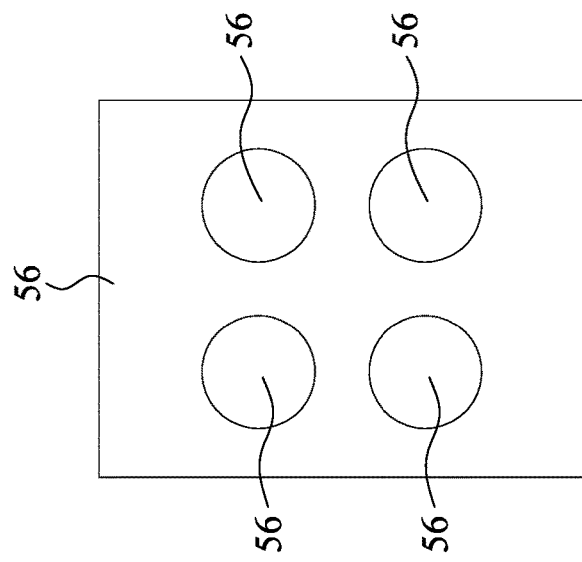
Figure 21A:
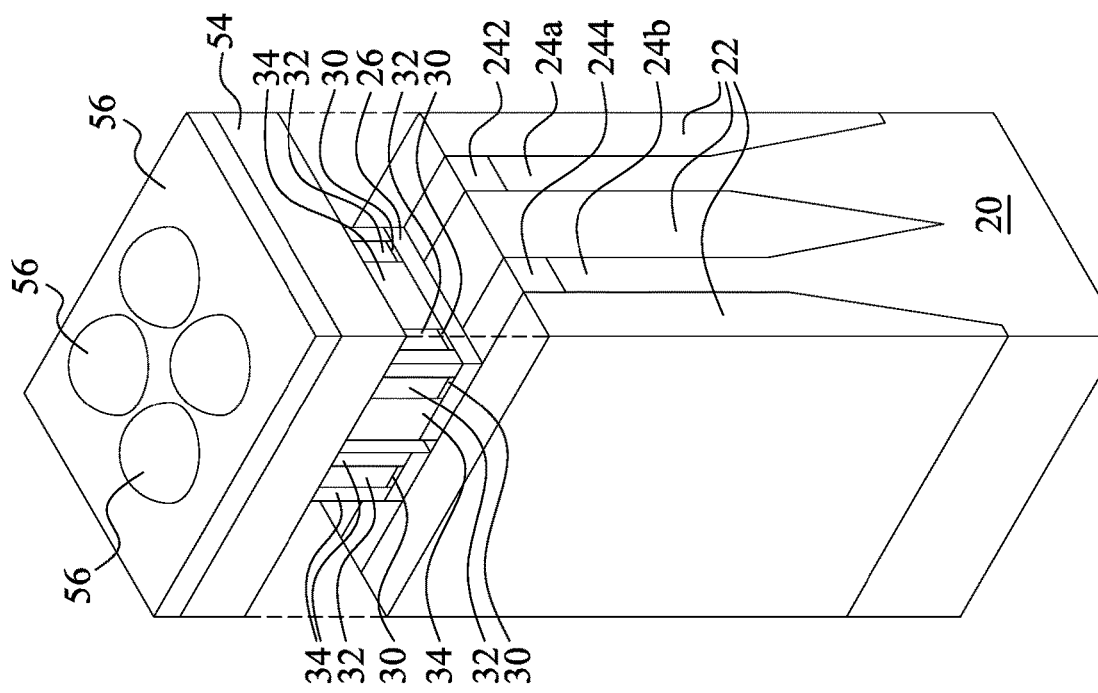

Reference is made to FIGS. 21A and 21B. A spacer 56 is formed on the third and fourth nanowires 48a and 48b and the filling metal 54. Examples of spacer material include dielectric material including but not limited to $Si_3N_4$ and $SiO_2$. The spacer 56 conforms to the protruding third and fourth nanowires 48a and 48b, resulting in bumps in the spacer 56 contour as shown in FIG. 21A.

Reference is made to FIGS. 22A and 22B. The source/drain materials are patterned. A photolithography and patterning process is performed to form the source/drain region 60 as shown in FIG. 22A. The photolithography and patterning process results in the exposure of the interlayer dielectric layer 38, the contact metal layer 52, and the filling metal 54. In some embodiments, the contact metal layer 52 may not be exposed after source/drain patterning. As shown in FIG. 22B, the source/drain region 60 stands in the central region and overlaps the gate structure 40. The source/drain region 60 has similar configuration as the gate structure 40, but the orientation is different. The source/drain region 60 is the mirror image of the spacer 36 of the gate structure 40. Gaps are formed between the two segments of the source/drain region 60, and the gaps reveal the underlying spacer 36 as shown in FIG. 22B. The source/drain region 60 is electrically connected to the third nanowires 48a and the fourth nanowires 48b.

Reference is made to FIGS. 23A and 23B. An interlayer dielectric layer 58 is deposited on the source/drain region 60. For the sake of clarity, the interlayer dielectric layer 58 is depicted in dotted line and seen through to show the source/drain region 60 therewithin. After the deposition of the interlayer dielectric layer 58, a planarization process, for example, CMP is performed. The bumps of the spacer 56 are flattened in the planarization process, and the underlying third and fourth nanowires 48a and 48b are exposed as shown in FIG. 23B.

Figure 24A:
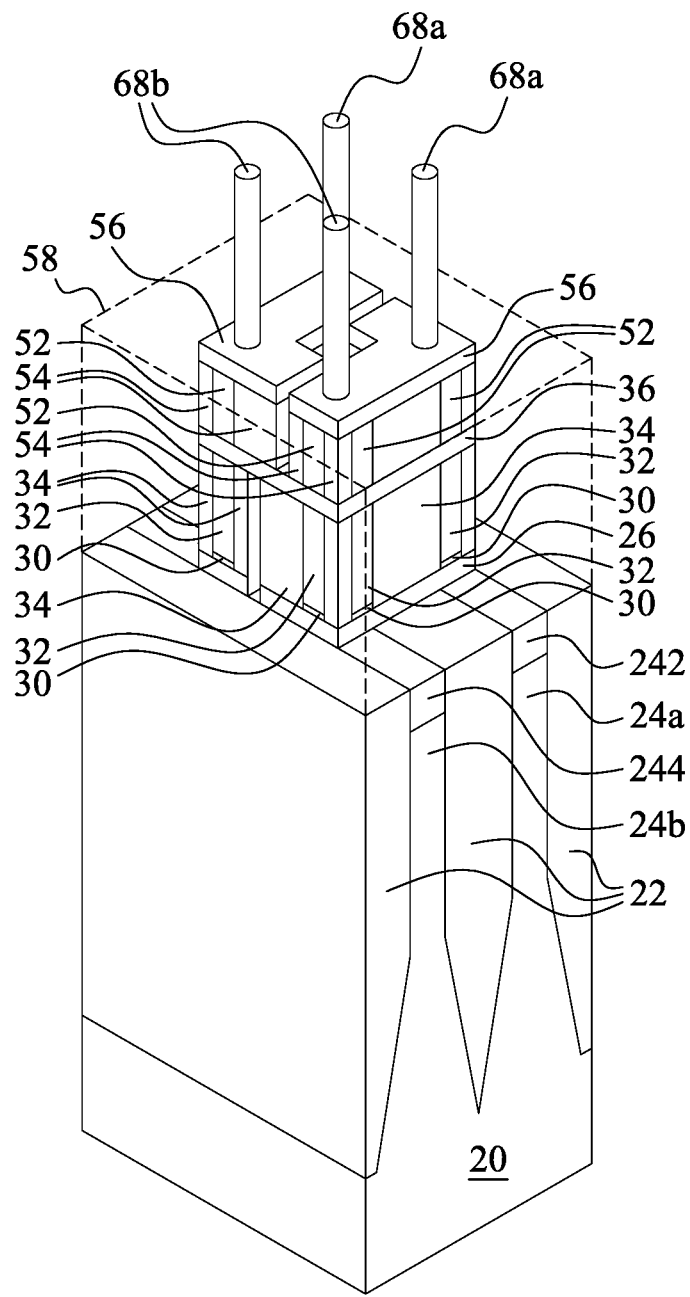
Figure 24B:
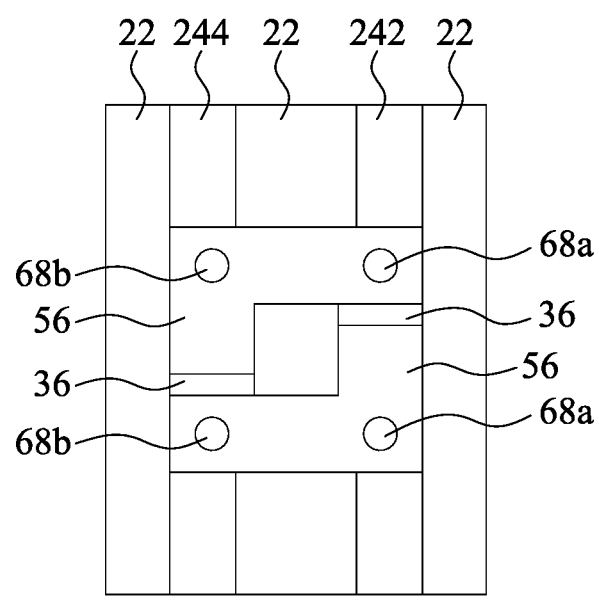

Reference is made to FIGS. 24A and 24B and operation 160 in FIG. 1. Fifth and sixth nanowires 68a and 68b are formed in a bottom-up manner. The spacer 56 is used as a template similar to the nanowire template 26 (see FIGS. 5A and 5B). The spacer 56 reproduces the pattern of the nanowire template 26, in which the third and fourth nanowires 48a and 48b are now acting as the first type nanowire foundation layer 242 and second type nanowire foundation layer 244 respectively. The fifth and sixth nanowires 68a and 68b are grown according to the pattern of the first nanowire 28a (third nanowire 48a) and second nanowires 28b (fourth nanowire 48b). The first type nanowire foundation layer 242 and second type nanowire foundation layer 244 are directly used to grow the first nanowires 28a and second nanowires 28b. The first and second nanowires 28a and 28b are then used to grow the third and fourth nanowires 48a and 48b respectively. Subsequently, the third and fourth nanowires 48a and 48b are used to grow the fifth and sixth nanowires 68a and 68b. The pattern of the first type nanowire foundation layer 242 and second type nanowire foundation layer 244 is carried over through the first, second, third and fourth nanowires 28a, 28b, 48a, and 48b to the fifth and sixth nanowires 68a and 68b. The fifth and sixth nanowires 68a and 68b may be seen as an extension of the first and second nanowires 28a and 28b. A photolithography process may be used for separately growing the fifth and sixth nanowires 68a and 68b. In some embodiments, the fifth nanowires 68a may be made of InAs, and the sixth nanowires 68b may be made of Ge.

Figure 25A:
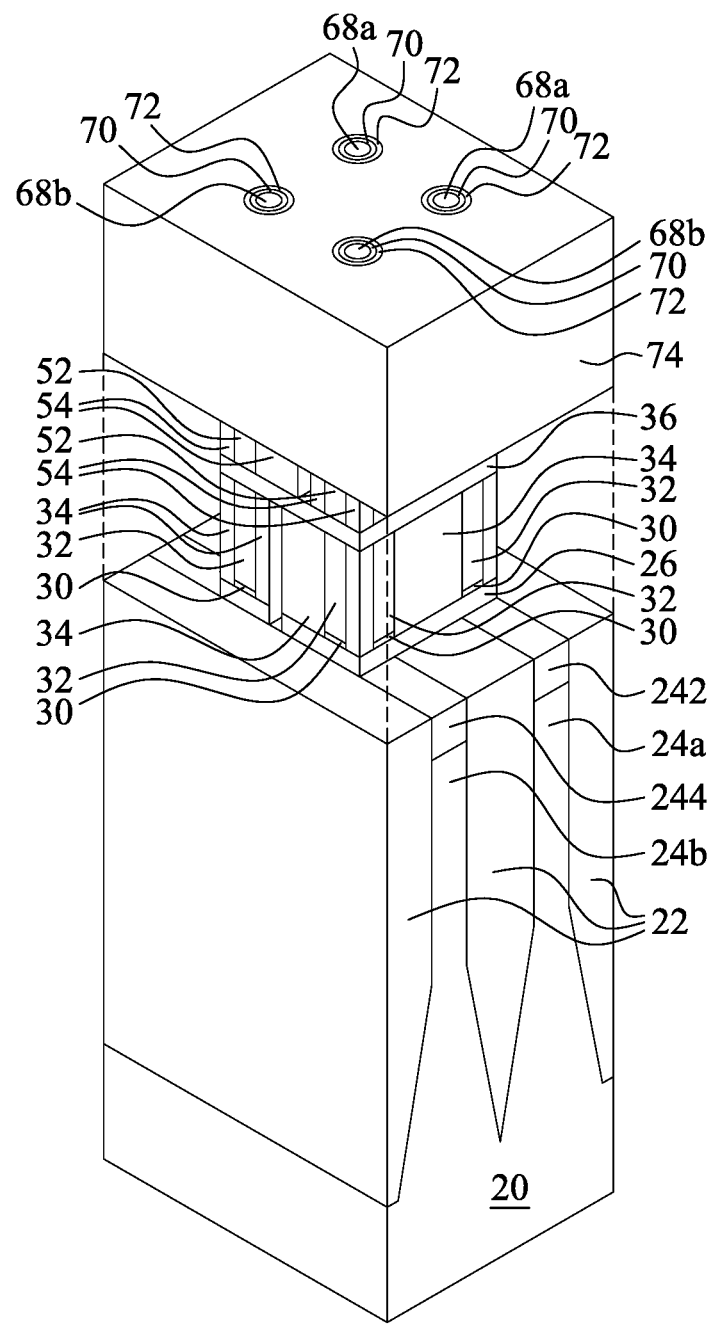
Figure 25B:
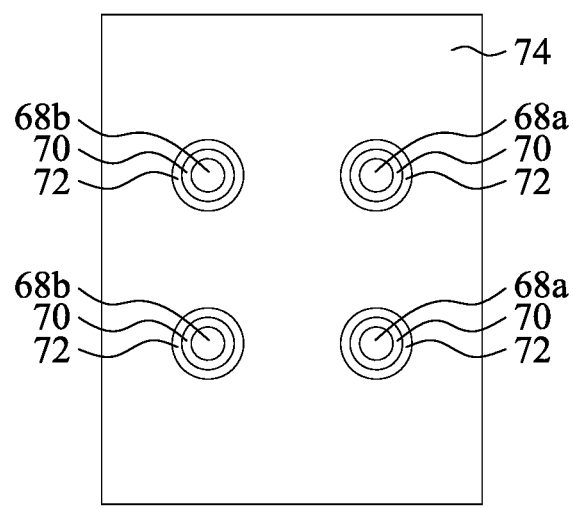

Reference is made to FIGS. 25A and 25B and operation 170 in FIG. 1. A gate dielectric layer 70, a metal gate layer 72 and a filling metal 74 are formed on the spacer 56. The gate dielectric layer 70 and metal gate layer 72 conform to the fifth and sixth nanowires 68a and 68b. The fifth and sixth nanowires 68a and 68b undergo similar process as described in FIGS. 9A, 9B, 10A and 10B. A ring of the gate dielectric layer 70 is left between the metal gate layer 72 and the spacer 56. The filling metal 74 is deposited on the spacer 56 and the interlayer dielectric layer 58 to cover up the entire fifth and sixth nanowires 68a and 68b. After the filling metal 34 deposition, a planarization process is performed. This planarization process cuts short the height of the fifth and sixth nanowires 68a and 68b (i.e, the removal of the top portion thereof) and continues to a level in which the gate dielectric layer 70 and the metal gate layer 72 come into view again as shown in FIG. 25B.

Figure 26A:
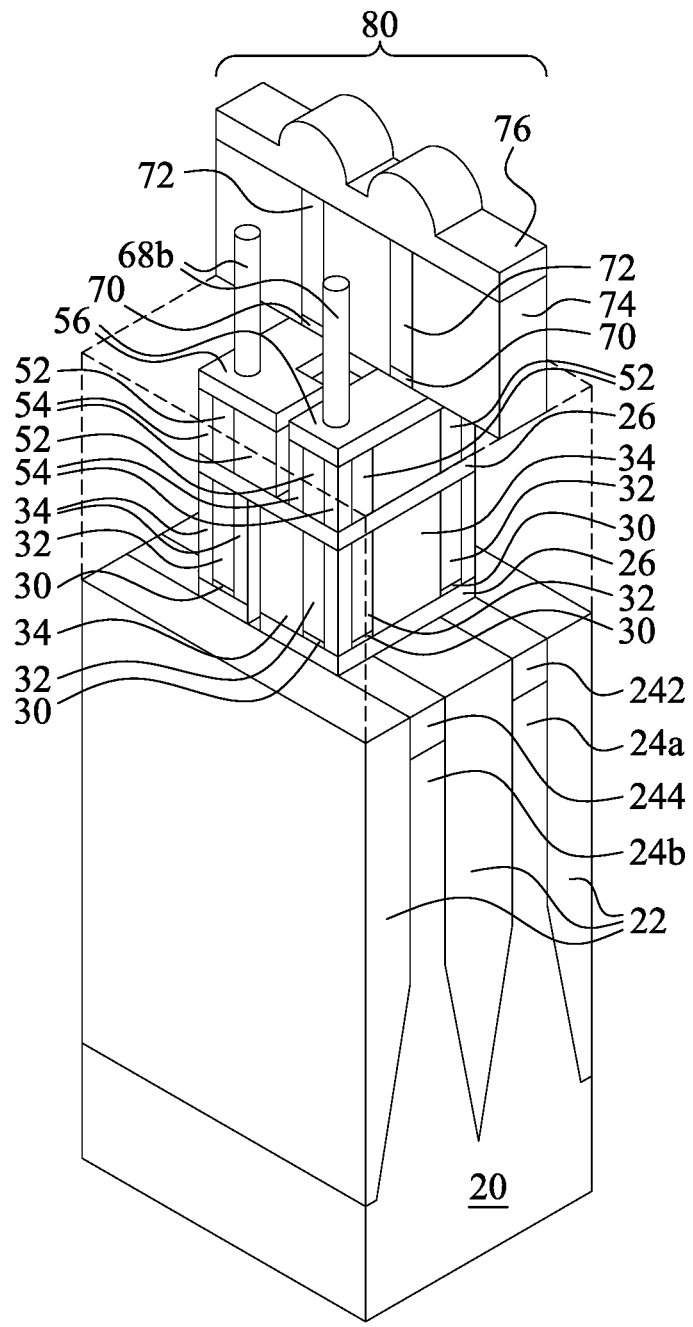
Figure 26B:
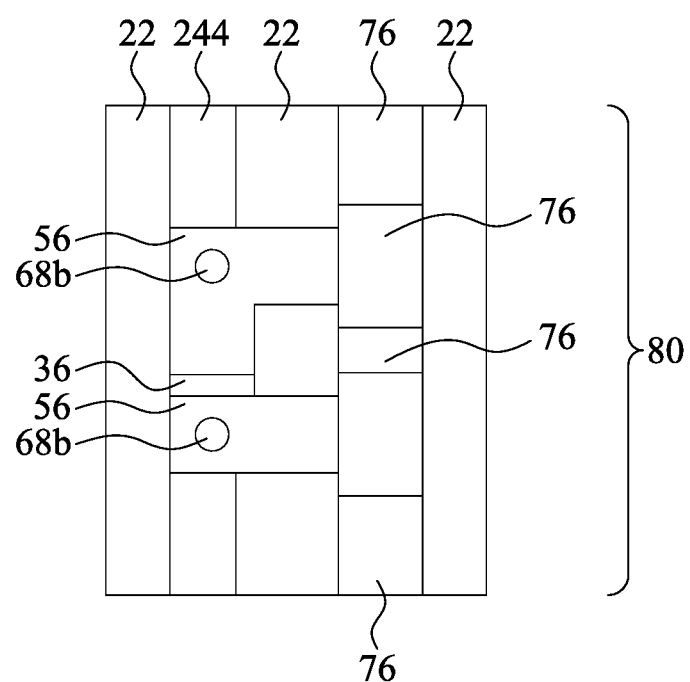

Reference is made to FIGS. 26A and 26B. A spacer 76 is formed on the filling metal 74. A selective recession process is performed before the deposition of the spacer 76. In order to reveal one terminal of the fifth and sixth nanowires 68a and 68b, the surrounding materials are recessed. The surrounding materials include the outermost filling metal 74, metal gate layer 72 and gate dielectric layer 70. After the recessing process the fifth and sixth nanowires 68a and 68b are retained and protrude upwardly from the surface level of the filling metal 74.

Reference is still made to FIGS. 26A and 26B. The spacer 36 is then conformingly deposited on the filling metal 74. The top surface of the filling metal 74 and the protruding fifth and sixth nanowires 68a and 68b are underlying the spacer 76. A photolithography and patterning process is performed to form the word line 80. The word line patterning process results in the removal of filling metal 74, the metal gate layer 72 and the gate dielectric layer 70 from the sixth nanowires 68b. The sixth nanowires 68b are exposed on the spacer 56. The fifth nanowires 68a are wrapped up by the gate dielectric layer 70, the metal gate layer 72, and the filling metal 74, and the top portion of the fifth nanowire 68a, which is free of the gate dielectric layer 70, the metal gate layer 72 and the filling metal 74, are surrounded by the spacer 76, in which the bumps are formed. A selective etching may be used to achieve the pattern as shown in FIGS. 26A and 26B. The word line 80 extends along a direction that is similar to the first type nanowire foundation layer 242 and overhangs the gate structure 40 and source/drain region 60 with a lengthy, narrow strip configuration.

Figure 27A:
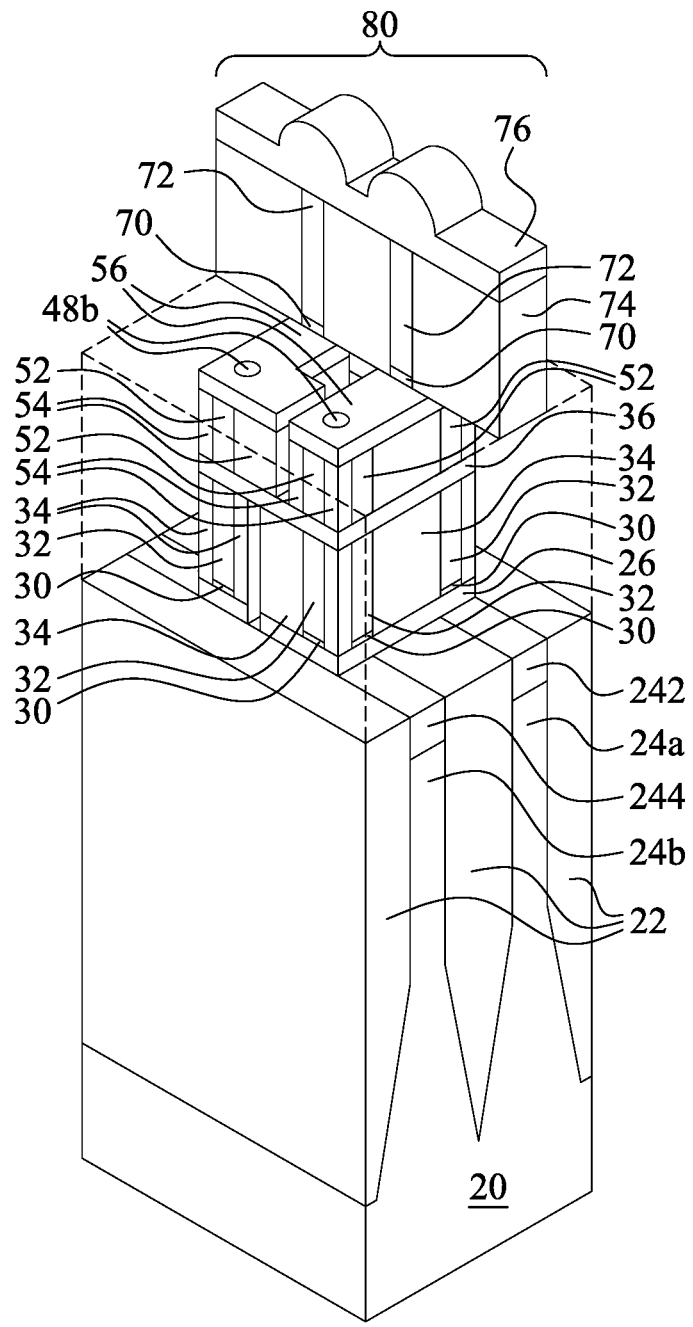
Figure 27B:
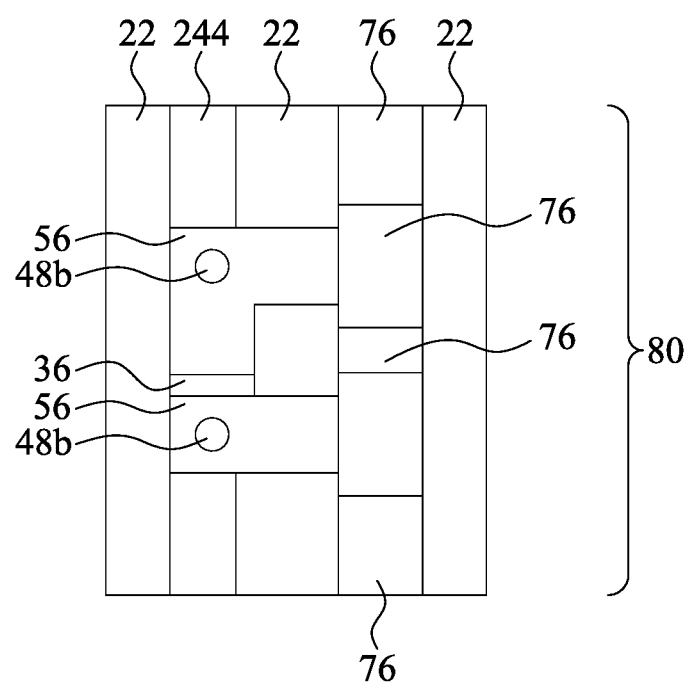

Reference is made to FIGS. 27A and 27B. The sixth nanowires 68b are removed. In some embodiments, a photoresist layer (not shown) is used to cover up the word line 80, and an etching is performed to remove the standing alone sixth nanowires 68b from the spacer 56 atop. The removal of the sixth nanowires 68b results in the exposure of the underlying fourth nanowires 48b of the source/drain region 60. In some other embodiments, the sixth nanowire removal operation can be omitted if the sixth nanowires 68b are not grown in the operation of FIG. 24A.

Figure 28A:
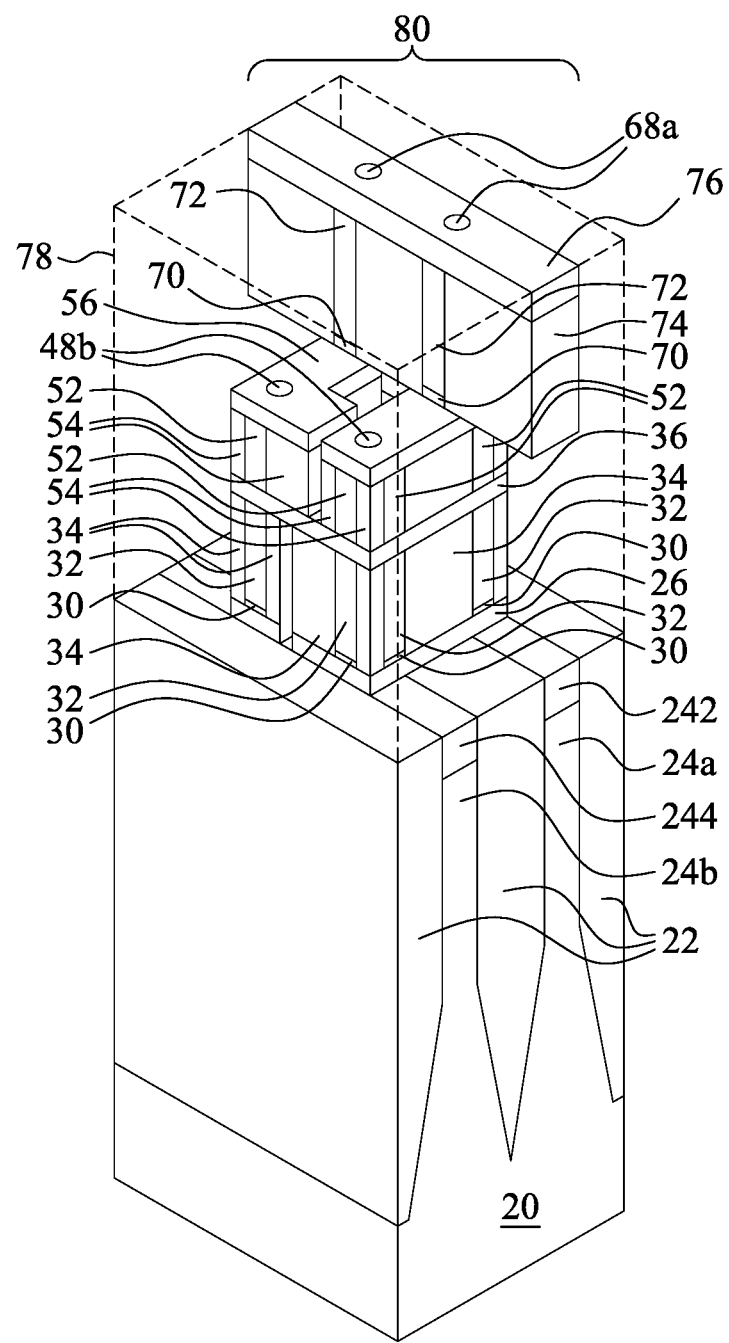
Figure 28B:
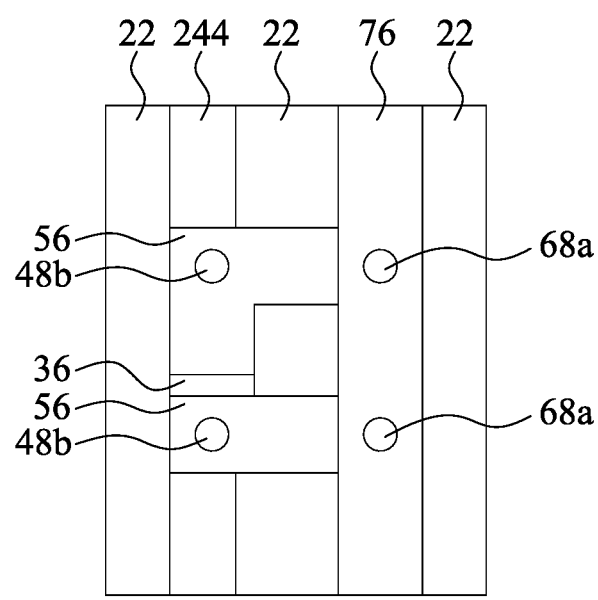

Reference is made to FIGS. 28A and 28B. An interlayer dielectric layer 78 is deposited on the existing interlayer dielectric layer 58. For the sake of clarity, the interlayer dielectric layer 78 is depicted in dotted line and seen through to show the word line 80 therewithin. After the deposition of the interlayer dielectric layer 78 a planarization process is performed. The bumps of the spacer 76 are flattened in the planarization process, and the underlying fifth nanowires 68a are exposed as shown in FIGS. 28A and 28B.

Figure 29A:
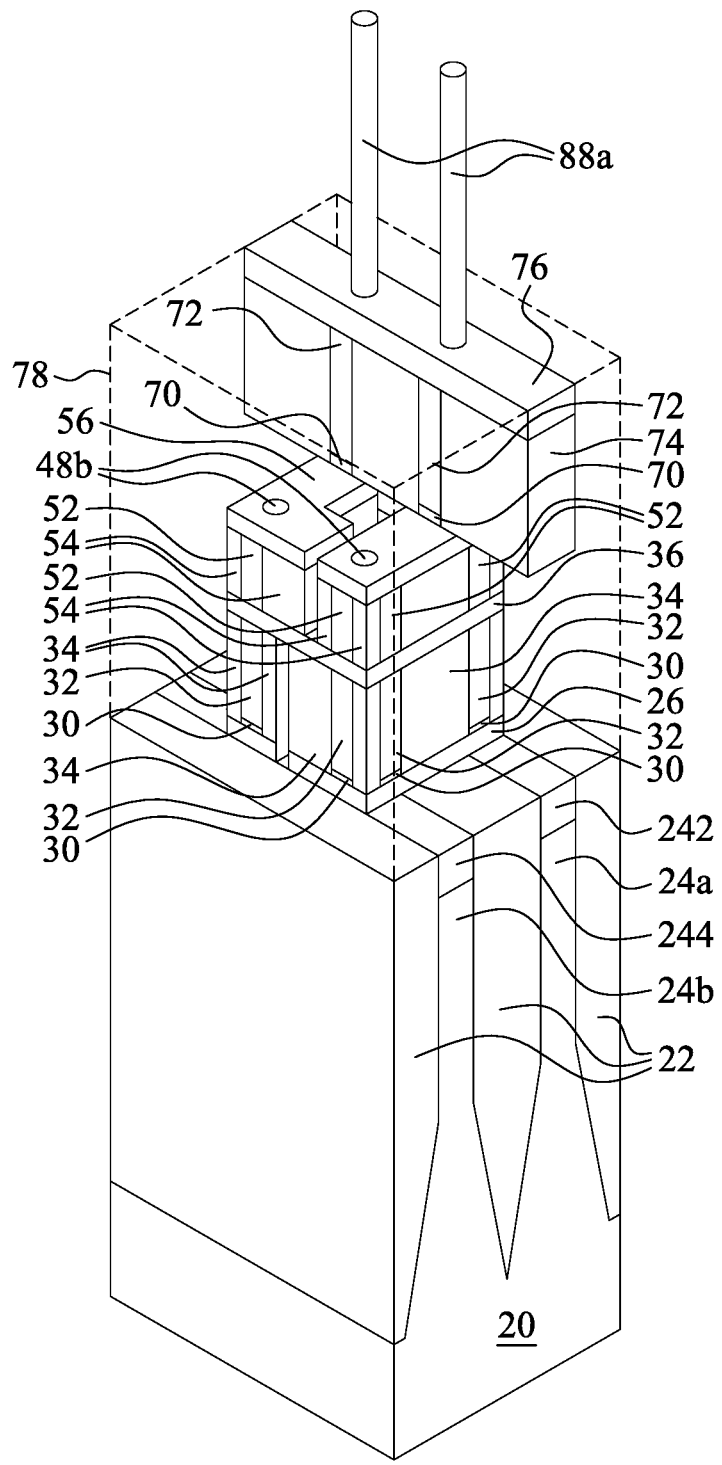
Figure 29B:
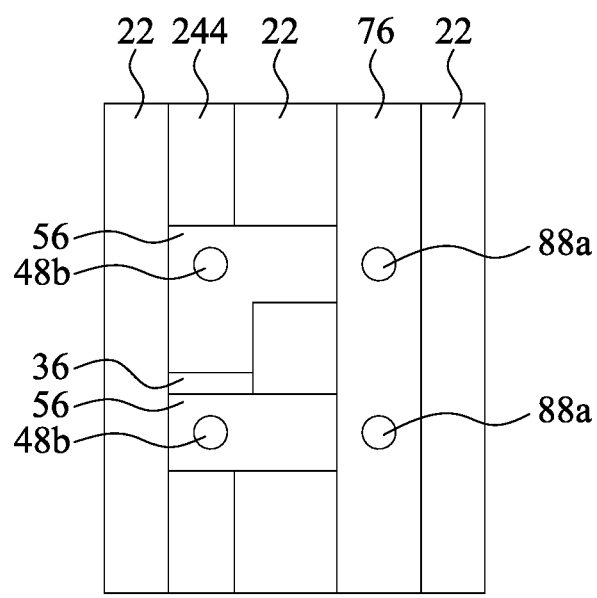

Reference is made to FIGS. 29A and 29B and operation 180 in FIG. 1. The spacer 76 and fifth nanowires 68a are used as the nanowire template for the bottom-up growth of the seventh nanowires 88a. The sixth nanowires 68b are removed, and the fourth nanowires 48b are buried under the interlayer dielectric layer 78 such that only the first type nanowire is reproduced in this stage. In some embodiments, the seventh nanowires 88a may be made of InAs.

Figure 30A:
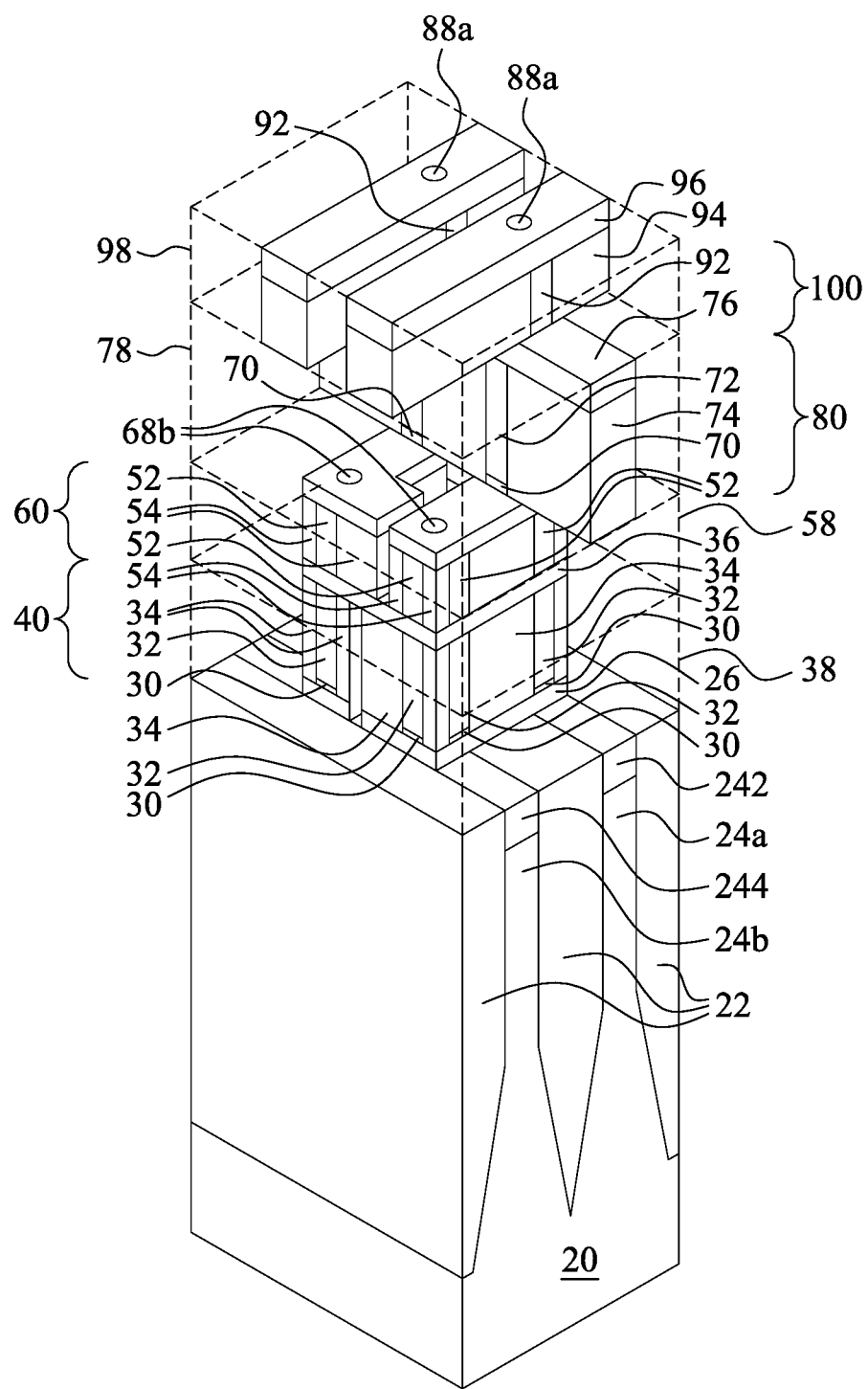
Figure 30B:
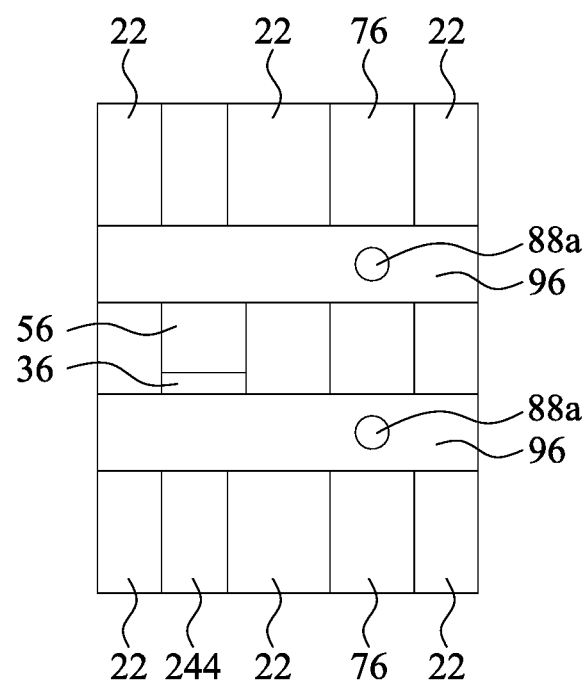

Reference is made to FIGS. 30A and 30B and operation 190 in FIG. 1A. Bit line 100 is formed on the word line 80 and wrapping the seventh nanowires 88a. The formation of the bit line 100 follows similar process as the formation of the word line 80. The difference between the bit line 100 and the word line 80 arises from the absence of the gate dielectric layer and the orientation, configuration of the filling metal 94 and the spacer 96. As such, the bit line 100 is electrically connected to the seventh nanowires 88a. After a photolithography and patterning process to form the bit line 100, the metal layer 92 that surrounds the seventh nanowires 88a is exposed, and the bit line 100 includes two independent strips, each strip having one of the seventh nanowires 88a. The seventh nanowires 88a are not connected through the filling metal 94 and the spacer 96. The bitline 100 is substantially perpendicular to the word line 80 and overhanging the word line 80. Subsequently, an interlayer dielectric layer 98 is deposited. A planarization process is then performed to remove the top portions of the interlayer dielectric layer 98 and the spacer 96 until the seventh nanowires 88a are exposed as shown in FIG. 30B. The spacer 96 and the exposed seventh nanowires 88a can be used as a nanowire template for the growth of another nanowire formed thereon. The semiconductor device includes the cross couple inverters (the first and second type nanowire foundation layers 242 and 244, the gate structure 40 and the source/drain region 60) at the lower level and the pass gate transistors (the source/drain region 60, the word line 80, and the bit line 100) at the upper level overlying the cross couple inverters as an SRAM cell.

Figure 31:
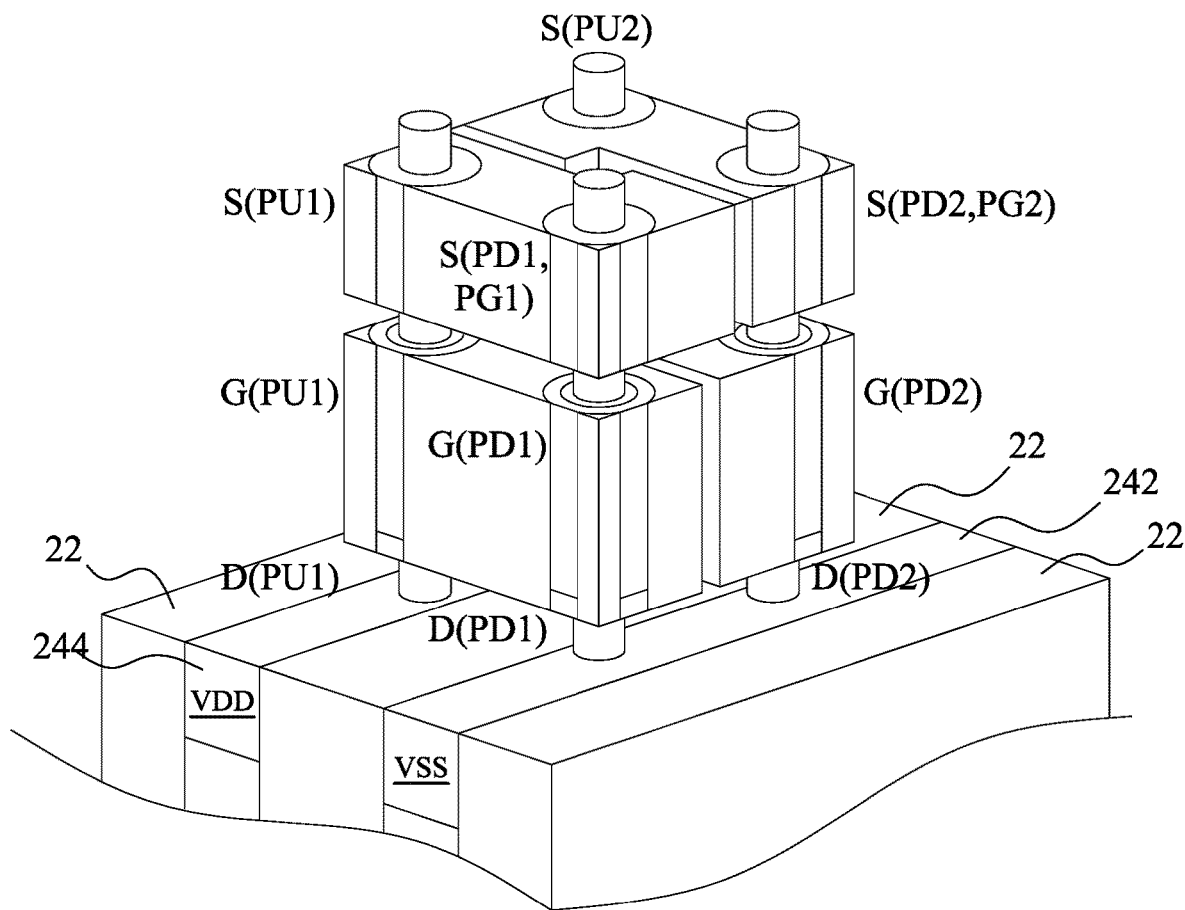
FIG. 31 is a perspective view of a portion of a vertical nanowire gate-all-around semiconductor device in accordance with some embodiments of the instant disclosure.

Reference is made to FIG. 31. FIG. 31 is a simplified view of FIG. 23A including the gate structure 40 and source/drain region 60 of the cross couple inverters. The nanowire template 26 and the spacers 36 and 56 of FIG. 23A are omitted in the diagram. The first and second type nanowire foundation layer 242 and 244 and the isolation regions 22 are labelled in FIG. 31. The pull-down transistors are designated as PD1 and PD2, the pull-up transistors are designated as PU1 and PU2, and gate, source/drain regions are designated as G, S, D respectively.

Reference is made to FIGS. 30A and 31. The semiconductor device realizes the vertical gate all around configuration for 6T SRAM architecture. Specifically, the semiconductor device includes 6 transistors PD1, PD2, PU1, PU2, PG1, and PG2. The transistors PD1, PD2, PG1, and PG2 are N-type transistors, and the transistors PU1 and PU2 are P-type transistors. The pull-down transistor PD1 includes a gate and source/drain regions. The first type nanowire foundation layer 242 serves as a source/drain region of the transistor PD1, one of the source/drain regions 60 serves as another source/drain region of the transistor PD1, and one of the gate structure 40 serves as the gate of the transistor PD1. The pull-up transistor PU1 includes a gate and source/drain regions. The second type nanowire foundation layer 244 serves as a source/drain region of the transistor PU1, one of the source/drain regions 60 serves as another source/drain region of the transistor PU1, and one of the gate structure 40 serves as the gate of the transistor PU1. The transistors PD1 and PU1 share the same gate structure 40 and the same source/drain region 60, and form an inverter. The pull-down transistor PD2 includes a gate and source/drain regions. The second type nanowire foundation layer 244 serves as a source/drain region of the transistor PD2, one of the source/drain regions 60 serves as another source/drain region of the transistor PD2, and one of the gate structure 40 serves as the gate of the transistor PD2. The transistors PU1 and PD2 share the second type nanowire foundation layer 244. The pull-up transistor PU2 includes a gate and source/drain regions. The first type nanowire foundation layer 242 serves as a source/drain region of the transistor PU2, one of the source/drain regions 60 serves as another source/drain region of the transistor PU2, and one of the gate structure 40 serves as the gate of the transistor PU2. The transistors PU2 and PD1 share the first type nanowire foundation layer 242. The transistors PD2 and PU2 share the same gate structure 40 and the same source/drain region 60, and form another inverter. Further, the source/drain region 60 of the transistors PD1 and PU1 is electrically connected to the gate structure 40 of the transistors PD2 and PU2 through one of the gate vias 44 (see FIG. 16A), and the source/drain region 60 of the transistors PD2 and PU2 is electrically connected to the gate structure 40 of the transistors PD1 and PU1 through another of the gate vias 44. As such, the transistors PD1, PD1, PU2, and PD2 form two cross couple inverters.

The pass gate transistor PG1 includes a gate and source/drain regions. One of the source/drain regions 60 serves as a source/drain region of the transistor PG1, one strip of the bit line 100 serves as another source/drain region of the transistor PG1, and the word line 80 serves as the gate of the transistor PG1. The transistors PG1, PD1, and PU1 share the source/drain region 60. Another of the source/drain regions 60 serves as a source/drain region of the transistor PG2, another strip of the bit line 100 serves as another source/drain region of the transistor PG2, and the word line 80 serves as the gate of the transistor PG2. The transistors PG2, PD2, and PU2 share the source/drain region 60. The transistors PG1 and PG2 share the same word line 80. As such, the transistors PD1, PD1, PU2, PD2, PG1, and PG2 form a 6-T SRAM device.

Figure 32:
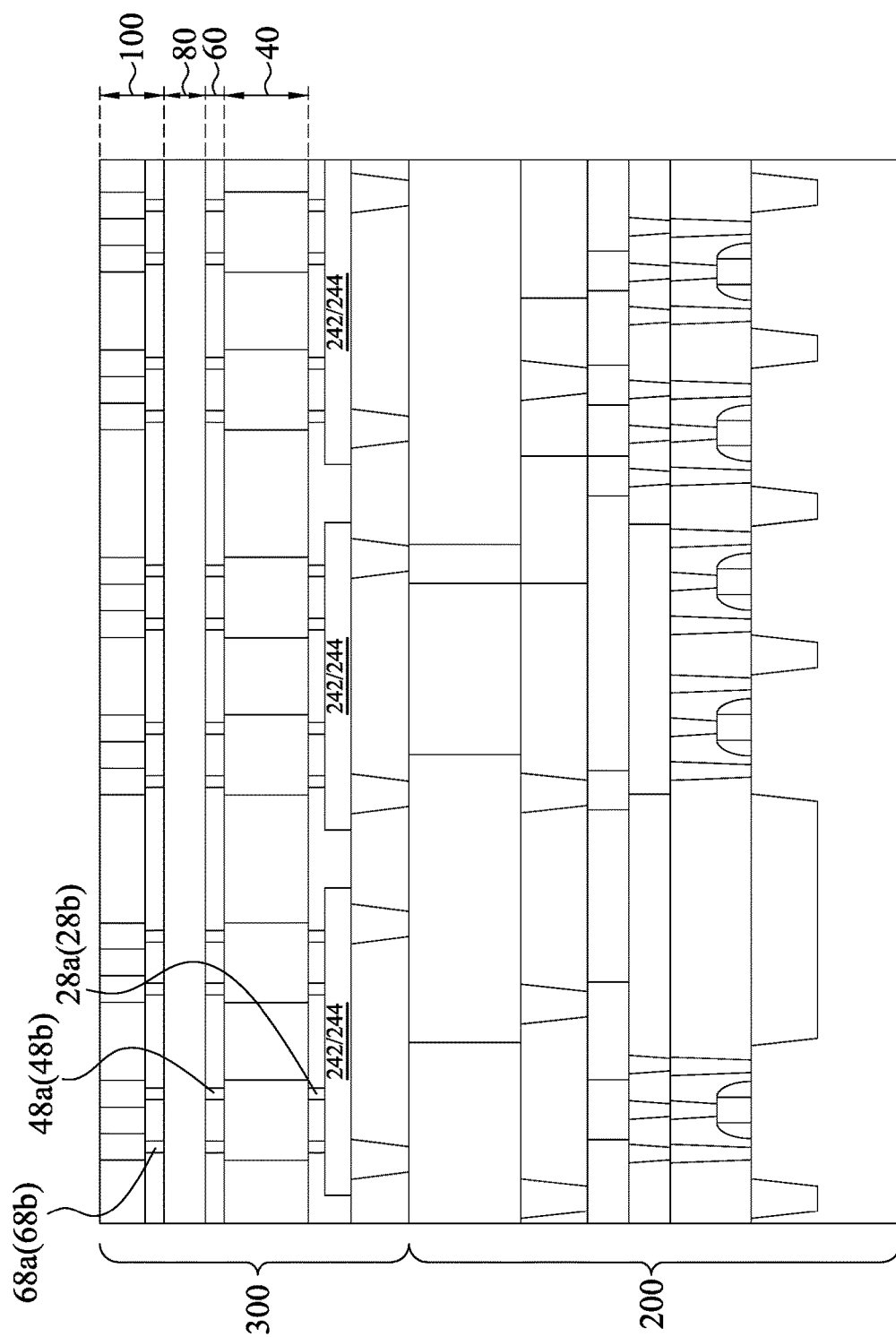
FIG. 32 is a schematic cross-sectional diagram illustrating a stacked VGAA SRAM on a CMOS in accordance with some embodiments of the instant disclosure.

Reference is made to FIG. 32, illustrating a schematic cross-sectional view of a complementary metal-oxide-semiconductor (CMOS) 200 having a stacked VGAA SRAM 300. The CMOS 200 includes gate structures, source and drain regions, isolation regions, contact vias in the interlayer dielectric layers. The VGAA SRAM 300 is disposed on the CMOS 200 in a monolithic fashion. This monolithic arrangement saves area on a semiconductor device because the lateral expansion is transferred to vertical direction. The insertion of the first type or second type nanowire foundation layer 242 or 244 on the semiconductor fins allows the monolithic integration between the CMOS 200 and VGAA SRAM 300 because the VGAA SRAM 300 has a lower thermal budget requirement, such that the device performance of CMOS 200 will not be affected. As shown in FIG. 32, the first and second type nanowire foundation layers 242 and 244 are formed as a portion of the semiconductor fins 24a and 24b. The first and second nanowires 28a and 28b are grown vertically over the first type and second type nanowire foundation layers 242 and 244 and used to form the gate structure 40 (cross coupled inverters), including the source/drain region 60. The word line 80 is stacked on the source/drain region 60 of the gate structure 40, and the bit line 100 is substantially perpendicular to the word line 80. The first nanowires 28a are used as the template for the third, fifth and seventh nanowires 48a, 68a and 88a. The second nanowires 28b are used as the template for the fourth and sixth nanowires 48b and 48b. The characteristics of the first type and second type nanowire foundation layers 242 and 244 are passed over to the next level in each of the nanowire growing process.

By inserting different types of nanowire foundation layer to replace the original semiconductor fin, a compact VGAA pattern can be created. This pattern results in SRAM area scaling to smaller than 0.005 µm$^2$. The nanowire foundation layer allows a bottom-up growth fashion that uses the underlying nanowire (nanowire foundation layer) as the template for the next level. The pull-up and pull-down gates can be connected without the need of several metal layers in different levels. Channel materials such as InAs which has high electron mobility can be used as the core of the nanowire. This VGAA SRAM can also be integrated with regular logic CMOS, in which the logic CMOS is at level one and the VGAA SRAM is at level two in a monolithic fashion.

A semiconductor device includes a substrate, an N-type bottom vertical gate-all-around (VGAA) transistor, a P-type bottom VGAA transistor, and a top VGAA transistor. The N-type bottom vertical gate-all-around (VGAA) transistor is over the semiconductor substrate and comprising a first nanowire made of InAs. The P-type bottom VGAA transistor is over the semiconductor substrate and comprising a second nanowire made of Ge. The top VGAA transistor is over the N-type bottom VGAA transistor, in which the top VGAA transistor includes a third nanowire in contact with the N-type bottom VGAA transistor, a fourth nanowire on and in contact with the third nanowire, and a bit line wrapping the fourth nanowire.

A semiconductor device includes a semiconductor substrate having a first fin and a second fin, a first nanowire over the first fin, a second nanowire over the second fin, in which the first nanowire and the second nanowire have different conductivity types, a first gate metal layer wrapping around the first nanowire, a second gate metal layer wrapping around the second nanowire, a third nanowire over and contacts the first nanowire, a fourth nanowire over and contacts the second nanowire, a first contact metal wrapping around third nanowire, and a second contact metal wrapping around the fourth nanowire.

A semiconductor device includes a semiconductor substrate having a fin, a first nanowire over the fin, in which a lengthwise direction of the first nanowire is substantially vertical to a top surface of the fin, a first gate structure wrapping around the first nanowire, a second nanowire over and contacting the first nanowire, a contact metal wrapping around second nanowire, a third nanowire over and contacting the second nanowire, a second gate structure wrapping around the third nanowire, and a fourth nanowire over and contacting the third nanowire.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a semiconductor substrate;
an N-type bottom vertical gate-all-around (VGAA) transistor over the semiconductor substrate and comprising a first nanowire made of InAs;
a P-type bottom VGAA transistor over the semiconductor substrate and comprising a second nanowire made of Ge; and
a top VGAA transistor over the N-type bottom VGAA transistor, wherein the top VGAA transistor comprises:
a third nanowire in contact with the N-type bottom VGAA transistor;
a fourth nanowire on and in contact with the third nanowire; and
a bit line wrapping the fourth nanowire.

2. The semiconductor device of claim 1, wherein the first nanowire of the N-type bottom VGAA transistor is in contact with the third nanowire of the top VGAA transistor.

3. The semiconductor device of claim 2, wherein the N-type bottom VGAA transistor further comprises a source/drain region wrapping the first nanowire of the N-type bottom VGAA transistor, and the source/drain region of the N-type bottom VGAA transistor also serves as a source/drain region of the top VGAA transistor.

4. The semiconductor device of claim 1, wherein the N-type bottom VGAA transistor further comprises a fifth nanowire under and in contact with the first nanowire of the N-type bottom VGAA transistor.

5. The semiconductor device of claim 4, wherein the N-type bottom VGAA transistor further comprises a gate structure wrapping the fifth nanowire of the N-type bottom VGAA transistor.

6. The semiconductor device of claim 1, wherein the top VGAA transistor further comprises a word line wrapping the third nanowire of the top VGAA transistor.

7. The semiconductor device of claim 1, further comprising:

a first fin and a second fin over the substrate;
a first epitaxial layer between the first fin and the first nanowire; and
a second epitaxial layer between the second fin and the second nanowire.

8. The semiconductor device of claim 7, wherein the first epitaxial layer is made of made of InAs, and the second epitaxial layer is made of Ge.

9. A semiconductor device, comprising:
a semiconductor substrate having a first fin and a second fin;
a first nanowire over the first fin;
a second nanowire over the second fin, wherein the first nanowire and the second nanowire have different conductivity types;
a first gate metal layer wrapping around the first nanowire;
a second gate metal layer wrapping around the second nanowire;
a third nanowire over and contacts the first nanowire;
a fourth nanowire over and contacts the second nanowire;
a first contact metal wrapping around third nanowire; and
a second contact metal wrapping around the fourth nanowire.

10. The semiconductor device of claim 9, further comprising a dielectric layer extending from a position between the first gate metal layer and the first fin to a position between the second gate metal layer and the second fin.

11. The semiconductor device of claim 10, wherein portions of the first nanowire and the second nanowires are disposed in the dielectric layer.

12. The semiconductor device of claim 11, further comprising:
a first epitaxial layer between the first fin and the dielectric layer, wherein the first nanowire is in contact with the first epitaxial layer through the dielectric layer; and
a second epitaxial layer between the second fin and the dielectric layer, wherein the second nanowire is in contact with the second epitaxial layer through the dielectric layer.

13. The semiconductor device of claim 9, further comprising a spacer over the first and second gate metal layers and wrapping around the first and second nanowires.

14. The semiconductor device of claim 13, further comprising an interlayer dielectric surrounding the spacer and the first and second gate metal layers.

15. The semiconductor device of claim 9, further comprising a spacer over the first and second contact metals and wrapping around the third and fourth nanowires.

16. The semiconductor device of claim 9, further comprising a filling metal electrically connecting the first gate metal layer to the second gate metal layer.

17. A semiconductor device, comprising:
a semiconductor substrate having a fin;
a first nanowire over the fin, wherein a lengthwise direction of the first nanowire is substantially vertical to a top surface of the fin;
a first gate structure wrapping around the first nanowire;
a second nanowire over and contacting the first nanowire;
a contact metal wrapping around second nanowire;
a third nanowire over and contacting the second nanowire;
a second gate structure wrapping around the third nanowire; and
a fourth nanowire over and contacting the third nanowire.

18. The semiconductor device of claim 17, further comprising:

a first spacer between the first gate structure and the contact metal, and wrapping around the first nanowires; and a second spacer between the contact metal and the second gate structure, and wrapping around the second nanowire.

19. The semiconductor device of claim 17, wherein the first nanowire is in direct contact with a gate dielectric of the first gate structure, and the second nanowire is in direct contact with the contact metal.

20. The semiconductor device of claim 17, further comprising a metal layer wrapping around the fourth nanowire.

* * * * *